United States Patent
Kim et al.

(10) Patent No.: US 11,300,352 B2
(45) Date of Patent: *Apr. 12, 2022

(54) EXTERNAL MEMBER FOR HOME APPLIANCES HAVING LIGHT TRANSMITTING THROUGH-HOLES AND MANUFACTURING METHOD THEREFOR

(71) Applicant: LG Electronics Inc., Seoul (KR)

(72) Inventors: Sung Gab Kim, Seoul (KR); So Hee Bak, Seoul (KR); Ja Hun Koo, Seoul (KR); Youngwoo Kim, Seoul (KR); Pojin Kim, Seoul (KR); Byungchun Moon, Seoul (KR); Kuhyeong Lee, Seoul (KR); Hye Sun Jung, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/848,616

(22) Filed: Apr. 14, 2020

(65) Prior Publication Data

US 2020/0240703 A1    Jul. 30, 2020

Related U.S. Application Data

(63) Continuation of application No. 15/763,069, filed as application No. PCT/KR2016/009953 on Sep. 6, 2016, now Pat. No. 10,641,542.

(30) Foreign Application Priority Data

Sep. 25, 2015 (KR) .......... 10-2015-0137132
Oct. 5, 2015 (KR) .......... 10-2015-0140035
(Continued)

(51) Int. Cl.
F25D 23/02    (2006.01)
F25D 23/00    (2006.01)
(Continued)

(52) U.S. Cl.
CPC .......... *F25D 23/028* (2013.01); *F25D 23/00* (2013.01); *F25D 23/02* (2013.01); *F25D 23/06* (2013.01);
(Continued)

(58) Field of Classification Search
CPC ........ F25D 23/028; F25D 23/02; F25D 23/00; F25D 23/06; F25D 27/00;
(Continued)

(56) References Cited

U.S. PATENT DOCUMENTS 10,641,542 B2 *  5/2020  Kim .................. F25D 23/028
2003/0150699 A1  8/2003  Song et al.
(Continued)

FOREIGN PATENT DOCUMENTS

DE    102014201892    8/2015
EP    2975345    1/2016
(Continued)

OTHER PUBLICATIONS

EP Extended European Search Report issued in European Application No. 16848836.9, dated Apr. 26, 2019, 9 pages.
(Continued)

*Primary Examiner* — David D Davis
(74) *Attorney, Agent, or Firm* — Fish & Richardson P.C.

(57) ABSTRACT

The present disclosure relates to an external member for home appliances and a manufacturing method therefor. The external member has through-holes in a metal layer for transmitting light emitted from a light source, such as a light-emitting device mounted rear of the external member, are not exposed to the outside by a film layer attached to a front surface of the metal layer when the light-emitting device is turned off. The external member for home appliances can provides appearance of home appliances with improved luxuriousness and aesthetic sensibility.

18 Claims, 34 Drawing Sheets

(30) Foreign Application Priority Data

Oct. 16, 2015 (KR) .................. 10-2015-0144990
Jul. 28, 2016 (KR) .................. 10-2016-0096322

(51) Int. Cl.
*H01L 33/00* (2010.01)
*H05B 33/12* (2006.01)
*F25D 23/06* (2006.01)
*F25D 27/00* (2006.01)
H01L 25/075 (2006.01)
H01L 33/48 (2010.01)
H01L 33/58 (2010.01)
H01L 33/60 (2010.01)

(52) U.S. Cl.
CPC .............. *F25D 27/00* (2013.01); *H01L 33/00* (2013.01); *H05B 33/12* (2013.01); F25D 2327/001 (2013.01); F25D 2400/36 (2013.01); F25D 2700/12 (2013.01); H01L 25/0753 (2013.01); H01L 33/486 (2013.01); H01L 33/58 (2013.01); H01L 33/60 (2013.01); H01L 2933/0091 (2013.01)

(58) Field of Classification Search
CPC .......... F25D 2327/001; F25D 2400/36; F25D 2700/12; H01L 33/00; H01L 25/0753; H01L 33/486; H01L 33/58; H01L 33/60; H01L 2933/0091; H05B 33/12
See application file for complete search history.

(56) References Cited

U.S. PATENT DOCUMENTS

| | | |
|---|---|---|
| 2006/0261366 A1 | 11/2006 | Yang |
| 2010/0142211 A1 | 6/2010 | Boelstler et al. |
| 2011/0134627 A1 | 6/2011 | Hamlin et al. |
| 2013/0139966 A1 | 6/2013 | Chae et al. |
| 2014/0300263 A1 | 10/2014 | Sung et al. |
| 2015/0132598 A1 | 5/2015 | Choi et al. |
| 2015/0192352 A1 | 7/2015 | Sung et al. |

FOREIGN PATENT DOCUMENTS

| | | |
|---|---|---|
| EP | 3037759 | 6/2016 |
| JP | 2002357674 | 12/2002 |
| JP | 2010113348 | 5/2010 |
| JP | 2012108208 | 6/2012 |
| KR | 1020090090520 | 8/2009 |
| KR | 1020110072378 | 6/2011 |
| KR | 1020130061513 | 6/2013 |
| KR | 1020140121753 | 10/2014 |
| KR | 1020150081800 | 7/2015 |

OTHER PUBLICATIONS

EP Office Action in European Appln. No. 16848836.9 dated May 3, 2021, 10 pages.

* cited by examiner

EXTERNAL MEMBER FOR HOME APPLIANCES HAVING LIGHT TRANSMITTING THROUGH-HOLES AND MANUFACTURING METHOD THEREFOR

CROSS-REFERENCE TO RELATED APPLICATIONS

This application is a continuation of U.S. Ser. No. 15/763,069, filed on Mar. 23, 2018, which is a National Stage application under 35 U.S.C. § 371 of International Application No. PCT/KR2016/009953, filed Sep. 6, 2016, which claims the benefit of Korean Application No. 10-2016-0096322, filed on Jul. 28, 2016, Korean Application No. 10-2015-0144990, filed on Oct. 16, 2015, Korean Application No. 10-2015-0140035, filed Oct. 5, 2015, and Korean Application No. 10-2015-0137132, filed on Sep. 25, 2015. The disclosures of the prior applications are incorporated by reference in their entirety.

TECHNICAL FIELD

The present invention relates to an external member for home appliances and a method of manufacturing the same, and more particularly, to an external member in order for home appliances not to be exposed to the outside when the display part of displaying operation information of the home appliance does not display operation information and a method of manufacturing the same.

BACKGROUND

Generally, a home appliance is provided with a display assembly for displaying an operating state of home appliance. The display assembly may display every kind of information according to the operation of the home appliance in the form of numbers, letters, symbols, or pictures. Accordingly, a user can check the information output through the display assembly to determine the operating state of the home appliance, and perform an operation for operating the home appliance.

In recent home appliance, an external member is made of a metal material to make the appearance more luxurious, or an external member of a material coated so that the appearance has a texture such as the steel is used, and the external member is provided with the display such as above, thereby displaying the operation of the home appliance to the outside.

Korean Laid-Open Patent No. 10-2014-0121753 discloses a refrigerator having a display unit on a rear surface of a front surface of a refrigerator door and making the display part of the display unit be seen for the user through the plurality of the through-holes formed on the front surface. Also, the through-hole is formed through an etching or a laser drilling so as to be formed to a fine size.

However, the through-hole may be identified to the outside even if the hole is processed to a fine size, and, in particular, when the display part is viewed closely, the through-hole which the light does not pass through is visible, there is a problem which is poor in the appearance.

Particularly, a variation of the hole size may occur even if the hole is processed to a fine size, and thus there is a problem of causing the dissatisfaction of the user due to the variation of such hole size.

In addition, even if the hole filling processing is performed inside the through-hole, a concavo-convex shape may be formed on the front surface part, so that there is a problem that a foreign substance may be adhered or contaminated.

SUMMARY

According to the above technical background, the present invention is to provide the external member for home appliances which the through-hole arranged on the metal layer when the light-emitting device is turned off, is not exposed to the outside by arranging the plurality of through-holes penetrating the metal layer to the external member used as the front surface panel which implements the front surface appearance of the home appliance and attaching the film layer implementing the color or the texture of the front surface appearance of the home appliance on the front surface of the metal layer, and a method of manufacturing the same.

In addition, the present invention is to provide the external member for home appliances which is possible to improve the quality of operational information which is displayed through the through-hole when the light-emitting device is turned on, by adopting the structure of the through-hole which can reduce the influence such as the process error and a variation generated when forming the through-hole on the metal layer and a method of manufacturing the same.

In order to address the above-mentioned technical problem, according to an aspect of the present invention, there is provided an external member for home appliance including: a film layer that implements a color or a texture of a front surface of a home appliance; a metal layer which is attached to the rear surface of the film layer and covers the display assembly with the plurality of the light-emitting members arranged.

At this time, the metal layer includes a through-hole of penetrating the metal layer in a predetermined area corresponding to the plurality of light-emitting devices arranged to the display assembly and having a width of the front surface opening formed on the front surface of the metal layer is smaller than that of the rear surface opening formed on the rear surface of the metal layer and a light-transmitting ink layer filling the through-hole.

As the through-hole penetrating the metal layer has a width of the front surface opening is smaller than that of the rear surface of the opening and the opening of the front surface is not correctly coincides with that of the rear surface of the through-hole, it may prevent from light being emitted in a different shape from that of the front opening or light being emitted irregularly, viewed from the outside.

Further, for example, the through-hole through the metal layer has a tapered shape or a stepped shape in which the width is narrower from the rear to the front of the metal layer, so that light transmitting ink layer is less affected by the viscosity of the ink when filling the through-hole, the ink layer of the light-transmitting ink layer may be effectively filled without forming the empty space in the through-hole.

In an exemplary implementation, the ink layer may be printed to be protruded from the rear opening of the through-hole by a predetermined height. Further, in another implementation, the ink layer may be printed so as to cover a particular region of the rear surface of the metal layer as well as filling the through-holes. As described above, as the ink layer is provided be protruded from the opening of the rear opening of at least through-hole, it is possible to prevent the light-transmitting quality from being degraded by the incompletely filled ink layer in the through-hole while it is possible to perform the guide function of light transmitted toward the through-hole from the light-transmitting element.

According to another aspect of the present invention for reducing the influence such as the process error and a variation generated when forming the through-hole in the metal layer, there is provided a method of manufacturing the external member for home appliance, including the step of forming a plurality of through-holes which the width of the front surface opening formed on the front surface of the metal layer is smaller than that of the rear opening formed on the rear surface of the metal layer by injecting the etching liquid into the rear surface of the metal layer when forming the through-hole on the metal layer.

At this time, by adjusting the injection concentration, the injection speed, and the injection time, etc. of the etching liquid injected to the rear surface of the metal layer, the through-hole penetrating the metal layer has a tapered or a stepped shape in which the width is narrower from the rear surface to the front surface of the metal layer.

According to the present invention, the front surface of the metal layer covering the display assembly arranged with the plurality of light-emitting devices by the film layer implementing the color or the texture of the front surface of the home appliance is covered. Here, the plurality of through-holes (particularly, the front surface opening of the trough-hole) arranged on the predetermined region of the metal layer may be invisible by the film layer in order to transmit light emitted from the light-emitting device.

Accordingly, although light emitted from the light-emitting device when the light-emitting element is turned on sequentially passes through the ink layer filling the through-hole and the film layer, thereby displaying operation information of the home appliance on the front surface of the electric appliance, when the light-emitting device is turned off, the front surface opening of the through-hole is not exposed to the outside. Through this, it is possible to implement the appearance of a more luxurious and aesthetic sensibility.

According to the present disclosure, it is possible to prevent the damage of the film layer attached to the entire surface of the metal layer by using an etching liquid of a ferric chloride component that selectively reacts with the metal layer in the etching process of forming the through-hole in the metal layer. Accordingly, there is a benefit that it is possible to perform a process of directly forming a through-hole in a metal layer to which a film layer is attached without attaching the film layer thereon after forming the through-hole to the metal layer.

In addition, in general, a metal layer for use as an external member for home appliances is provided with a state which the film layer is attached on the front side and a back coating layer on the rear surface in order to prevent a contamination such as a corrosion of the metal layer. At this time, there is a benefit that the operation such as the separate film laminating process or the development, etc. is not need to be performed by marking the position which the back coating layer is formed with the through-hole when performing the etching process of forming the through-hole from the rear surface of the metal layer. Accordingly, the manufacturing cost can be lowered by improving a workability and a productivity

BRIEF DESCRIPTION OF DRAWINGS

FIG. 2 is a perspective view of the refrigerator door in a state in which the display part shown in FIG. 1 is turned on.

DETAILED DESCRIPTION

Hereinafter, the external member for home appliances according to the preferred implementations of the present invention and the method of manufacturing the same will be described in detail with reference to the accompanying drawings herein.

It is to be understood that the external member for home appliances herein is a member which forms the appearance of the home appliance and has the same meaning as the front surface panel. Therefore, in the following description, the external member and the front panel for home appliances may be used mixed to describe the present invention as necessary, but this is merely for convenience of the description and refer to the same member.

In addition, the steel plate herein is the metal plate of providing a rigidity to the external member for home appliances and is referred to as the steel plate or the metal plate hereinafter. However, the steel sheet may be referred to as a VCM steel plate or a PCM steel plate in which a film layer is attached to the front surface of the metal plate.

The present invention is not limited to the disclosed implementations below, but may be embodied in many different forms and the present implementations are provided to make the disclosure of the present invention complete and to indicate the scope of the invention completely for a person having an ordinary skill in the art.

In addition, various implementations with regard to the external member for home appliances disclosed below will be described by way of example for being mounted on the door of the refrigerator for convenience of an explanation and understanding, but the present invention is applicable to various home appliances which the external member described below is applicable.

Figure 1:
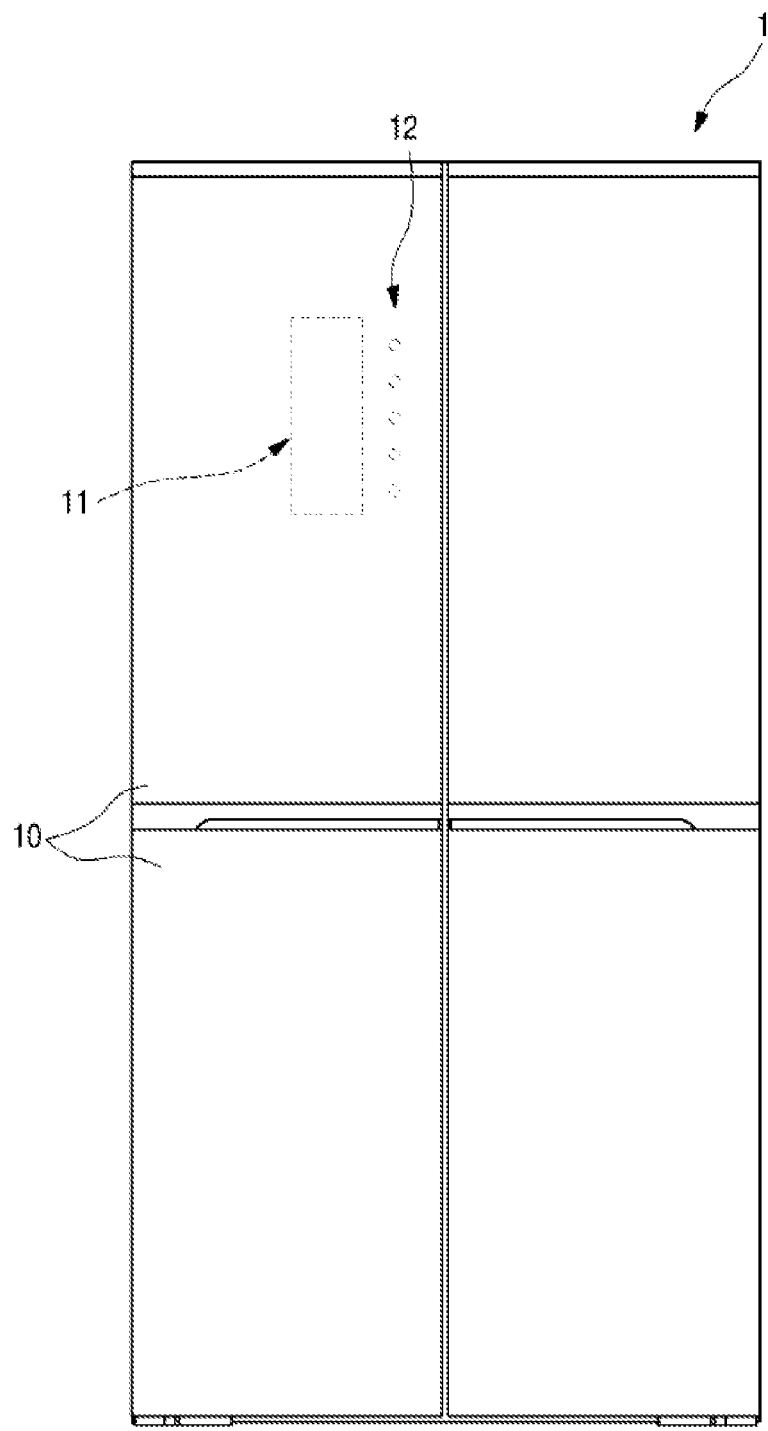
FIG. 1 is a front view of a refrigerator used with the external member (the front panel) for home appliances in accordance with an exemplary implementation of the present invention.

FIG. 1 is a front view of the refrigerator used with the external member (the front panel) for home appliances in accordance with an exemplary implementation of the present invention.

Referring to FIG. 1, an external shape of the refrigerator 1 is formed by a cabinet forming a storage space and a refrigerator door 10 installed in a cabinet to open and close an internal storage space. Here, the refrigerator door 10 is provided using the external member that implements the color or texture of the appearance of the refrigerator 1.

The internal storage space may be divided into left and right sides and/or upper and lower parts as necessary, and a plurality of refrigerator doors 10 to open and close the respective space may be provided on the opened front surface of the storage space. The refrigerator door 10 is configured to open and close the storage space by sliding or rotating, and is configured to form the front surface of the refrigerator 1 in a closed state.

The display part 11 and the touch operation part 12 are provided one side of the refrigerator door 10 of the plurality of the refrigerator door 10 (two doors in FIG. 1) at the height which the operation and the identification of the user is easy The display part 11 is a region for externally showing the operating state of the refrigerator 1 (for example, a temperature, a humidity, an operation mode, etc.). The display part 11 transmits light transmitted from the inside to the outside of the refrigerator door 10 and is displayed as the symbols or the numbers, and the user can check the operating state of the refrigerator through the information displayed on the display part 11.

In addition, according to the present invention, when light is not transmitted from the inside to the outside of the refrigerator door 10, the display part 11 can be invisible from the outside of the refrigerator 1 as shown in FIG. 1. That is, when the display part 11 does not need to display any operating state of the refrigerator 1, the display part 11 can be configured to be invisible from the outside of the refrigerator 1. As a result, the refrigerator 1 looks like the refrigerator 1 does not include any elements to display operating state of the refrigerator 1.

The touch operation part 12 is a part operated by a touch. For example, a switch or a button can be used to confirm an operation state of the refrigerator 1 or to change the operation state.

The touch operation part 12 is provided at a portion of the front surface of the refrigerator door 10. A portion of the touch operation part 12 that detects touch input can be printed or etched.

In some implementations, the touch operation part 12 may be provided in a refrigerator door other than the refrigerator door 10 that includes the display part 11. In some implementations, the touch operation part 12 may be provided in the cabinet.

In some implementations, the touch operation part 12 may be invisible from the outside of the refrigerator 1 when light is not transmitted from the inside to the outside of the refrigerator door 10 through the display part 11.

Figure 2:
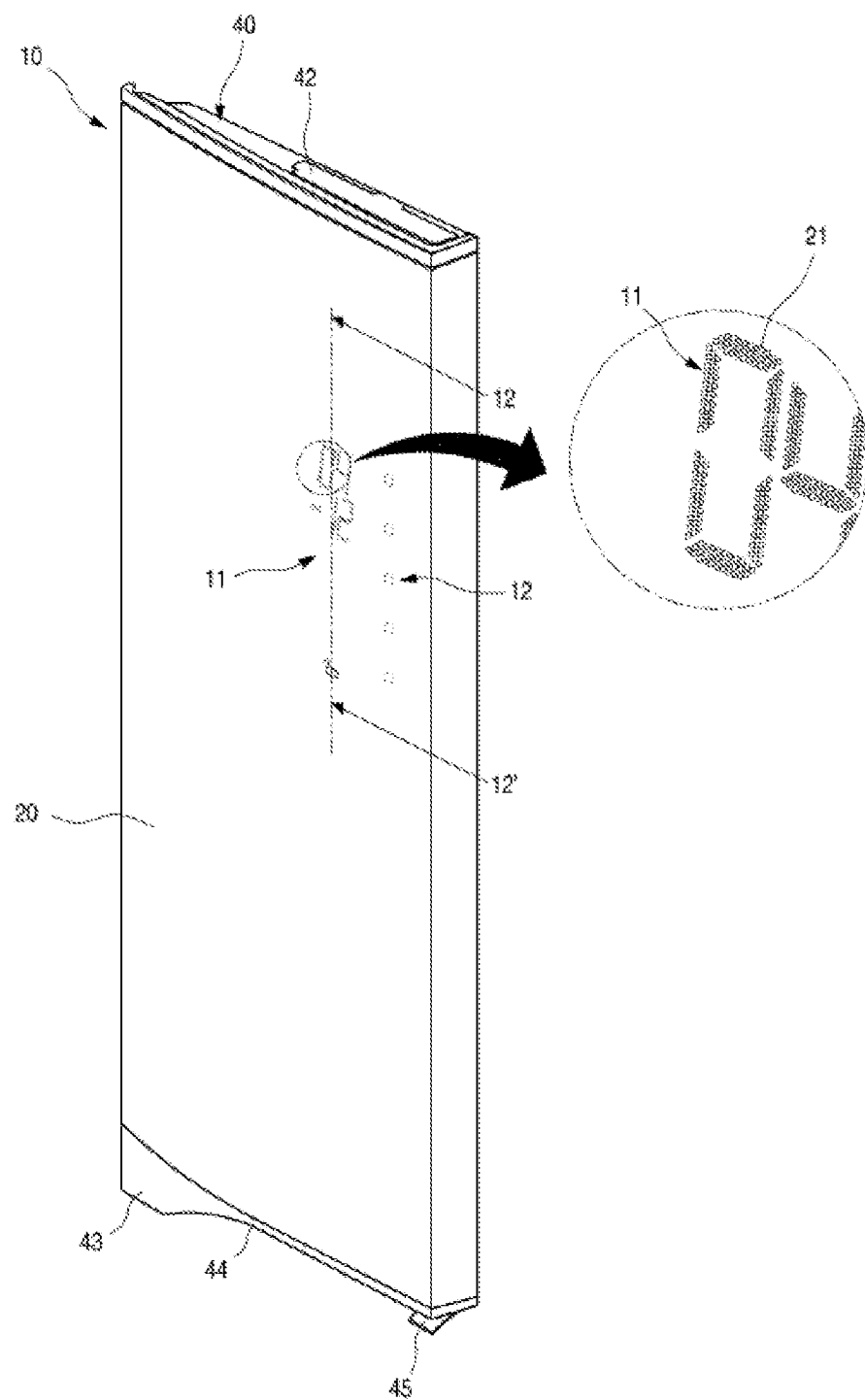
Figure 3A:
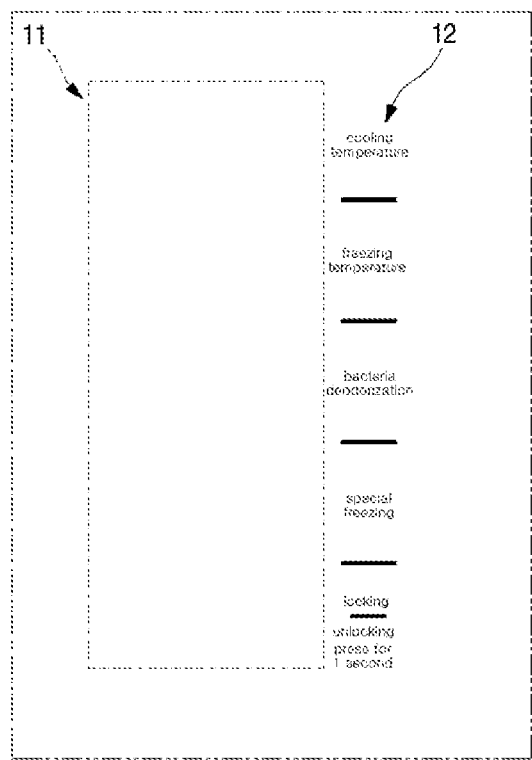
FIGS. 3A and 3B are a top view showing a state in which the display part of the refrigerator door shown in FIG. 1 turn off (FIG. 3A) and turn on (FIG. 3B).
Figure 3B:
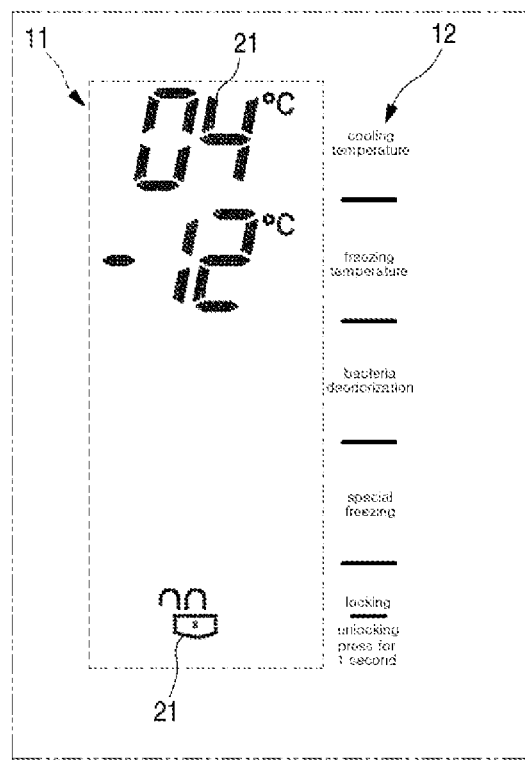

FIG. 2 is a perspective view of the refrigerator door in a state in which the display unit shown in FIG. 1 is turned on, and FIGS. 3A and 3B are a top view showing a state in which the display part of the refrigerator door shown in FIG. 1 turn off (FIG. 3A) and turn on (FIG. 3B).

Referring to FIG. 2, the front appearance of the refrigerator door 10 is formed with the external member 20 as a whole.

The entire appearance of the refrigerator door 10 is formed by the combination of the external member 20 that forms the appearance (the color, the texture, etc.) of the front surface, a door liner 30 that forms a rear appearance, and a decorative member 40,43 provided at the upper and lower ends of the refrigerator door 10.

More specifically, the external member 20 defines the front appearance of the refrigerator door 10, and may further include the entire front surface of the refrigerator door 10, as well as at least one side of the refrigerator door 10. In addition, the external member 20 can include a front panel that can prevent a fingerprint. In some implementations, the external member 20 can include a front panel that has a particular pattern or design. For example, the external member 20 can have brushed metal patterns.

The display part 11 may be defined by a plurality of through-holes 21 formed in a particular region of the external member 20. The display part 11 may include a set of a plurality of through-holes 21 perforated in a predetermined arrangement to indicate letters, numbers, figures, or symbols (hereinafter, referred to as "segments"). For example, as shown in FIG. 2, the set of the plurality of through-holes 21 may be arranged in the shape of the number "4." As another example, as show in FIGS. 3A and 3B, the plurality of through-holes 21 may be arranged to indicate a specific symbol, a form of the shape, or a letter to provide information about the state of the refrigerator 1.

The display part 11 can display the segments when light is transmitted from the inside to the outside of the external member 20 through the through-hole 21.

The plurality of through-holes 21 form one unit set and they may be arranged such that one unit set including the plurality of through-holes 21 shapes one segment or the plurality of units shape a segment (for example, 4 unit sets shape each side of the square).

In addition, light of the light-emitting device mounted on the inside of the external member 20 is emitted by irradiating light toward the unit set of the corresponding the through-holes 21 through the plurality of through-holes 21 forming one unit set. At least of the light-emitting device arranged inside the external member 20 may be arranged at the position corresponding to one unit set including the plurality of through-holes 21. As the number of the light-emitting device arranged per one unit set increases, the brightness of the segment displayed by turn-on of the light-emitting device may be improved.

In addition, when one unit set including the plurality of through-holes 21 shapes one segment as a whole, it may be preferable that the number of the light-emitting elements arranged per one unit set is arranged in plural to implement a sufficient brightness of the segments. However, when the plurality of unit sets shape one segment (for example, four unit sets shape each side of a square), a region occupied by one segment is smaller than the case which one unit set shapes one segment as a whole, and thus, the number of the light-emitting device arranged per one unit set may be sufficient even with one.

The through-hole 21 is formed by etching processing on the rear surface of the external member 20 and the open front surface (i.e., the front opening) of the through-hole 21 is shielded by the film layer of forming the surface of the external member 20.

Here, the film layer is configured to transmit light as well as defining a color or a texture of the front surface of the refrigerator 1. Therefore, since the inside of the external member 20 is relatively darker than the outside in a state the light-emitting device of the external member 20 is turned on, the through-hole 21 becomes invisible. In particular, when the color of the film layer is rather high, or the film layer includes a thin metal film layer, the through-hole 21 may be effectively invisible.

Accordingly, as shown in FIG. 3A, the through-hole 21 to form a display part 11, when of the light-emitting device is turned off, is invisible from the outside. Therefore, it has an appearance which may be felt as not existing the through-hole 21 in the external member 20.

When the user touches the touch operation part 12 in such state, or when the light-emitting device mounted on the inside of the external member 20, by which action that is already set up, is turned on, light emitted from the light-emitting device is transmitted through the through-hole 21 and is discharged to the outside.

At this time, the segment arranged on the upper part of the light-emitting device which is turned on according to the selective turn-on and the turn-off, and the segment arranged on the upper part of the turn-off light-emitting device is not displayed, thereby displaying the specific segment.

For example, as shown in FIG. 3B, information according to a set of segments such as 4, −12° C. can be displayed by the selective turn on and turn off the light-emitting device. That is, a good effect that only a specific segment is displayed on the refrigerator door 10 in a state in which a separate display is not visible on the front surface of the refrigerator door 10 can be obtained.

Figure 4:
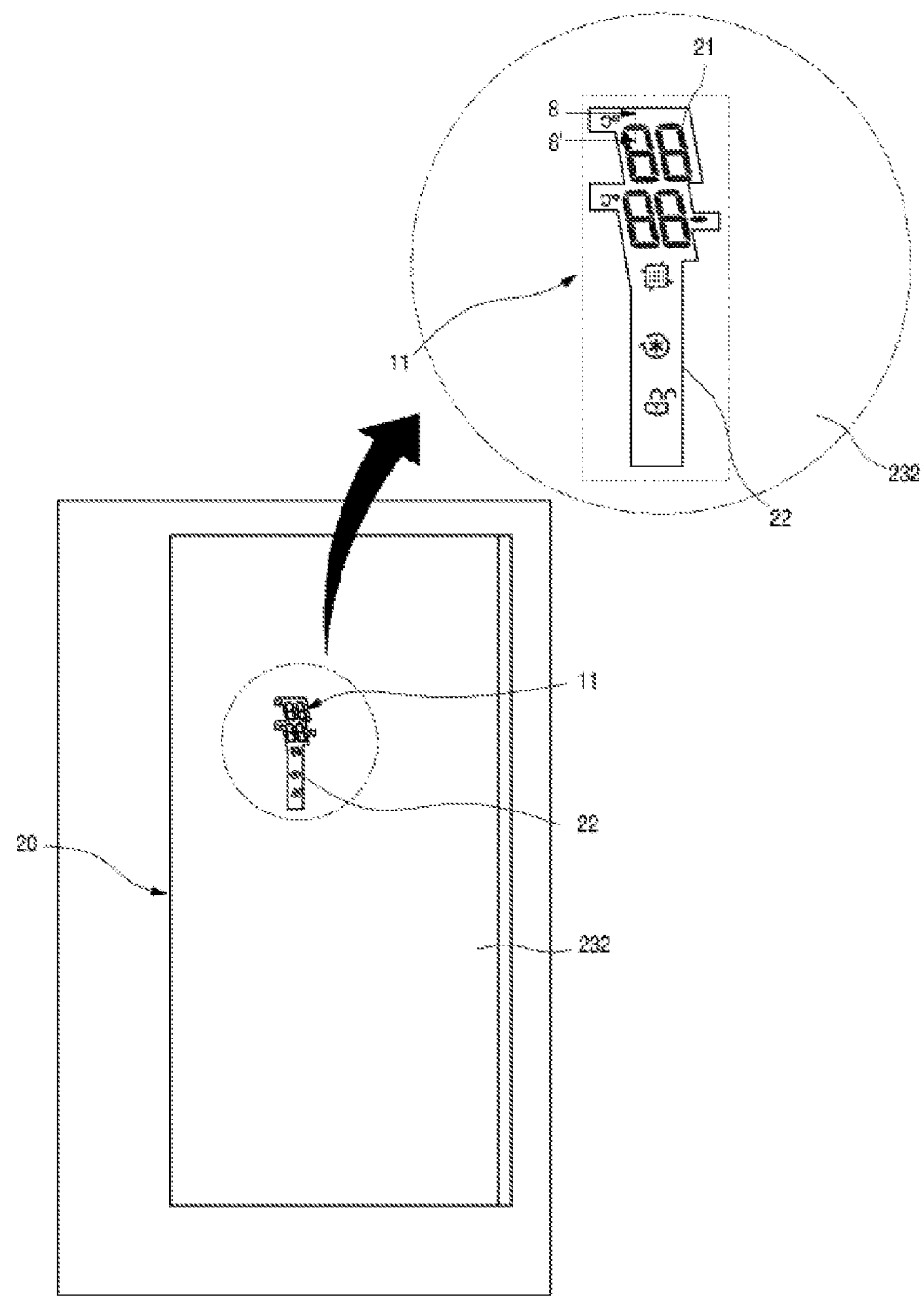
FIG. 4 is a rear view of the refrigerator door shown in FIG. 2.

FIG. 4 is a rear view of the refrigerator door shown in FIG. 2.

As shown in FIG. 4, the external member 20 may be formed in a plate type and may be bent to implement at least a part of the sides of the refrigerator door 10. In addition, since the external member 20 forms the appearance of the refrigerator door 10, it is preferable that is is formed to have a sufficient thickness to ensure a sufficient strength. The front surface of the external member 20 is positioned with the film layer of implementing the color or texture of the appearance of the home appliance and the rear surface of the external member 20 is positioned with the steel plate that shows the overall shape of the refrigerator door 10 and provides rigidity of the refrigerator door 10. The rear surface of the steel plate may be provided with a back coating layer 232 to prevent a contamination such as a corrosion of the steel sheet.

The display part 11 of the external member 20 is provided with the plurality of through-holes 21 and the empty space formed by the through-hole 21 is filled with the ink layer 22. The ink layer 22 may be formed on the rear surface corresponding to the display part 11 of the external member by a screen printing method, etc. When the back coating layer 232 is provided on the back surface of the external member 20, the rear coating layer 232 is removed only in the region corresponding to the display part 11, and the ink layer 22 may be printed at the region removed with the back coating layer 232.

Although the ink layer 22 may be printed to fill only the empty space formed by the through-hole 21, is the ink layer 22 can be printed to be protruded from the rear openings of the through-holes 21 by a predetermined height. In addition, as shown in FIG. 4, the ink layer 22 may be provided to cover a portion of the rear surface of the external member 20 as well as filling the through-hole 21.

That is, it is possible to prevent the ink layer 22 from being filled incompletely in the through-hole 21, by having the ink layer 22 to be protruded from the rear surface opening of the through-hole 21 by a predetermined height as well as covering a region of the rear surfaces of the external member 20.

Particularly, even when the inner circumferential surface or the rear surface opening of the through-hole 21 is not smoothly etched in the etching process for forming the through-hole 21, since the ink layer 22 can be over-filled, it may prevent the quality of light transmitting quality from being degraded by the ink layer 22 which fills the through-hole 21 incompletely.

Figure 5:
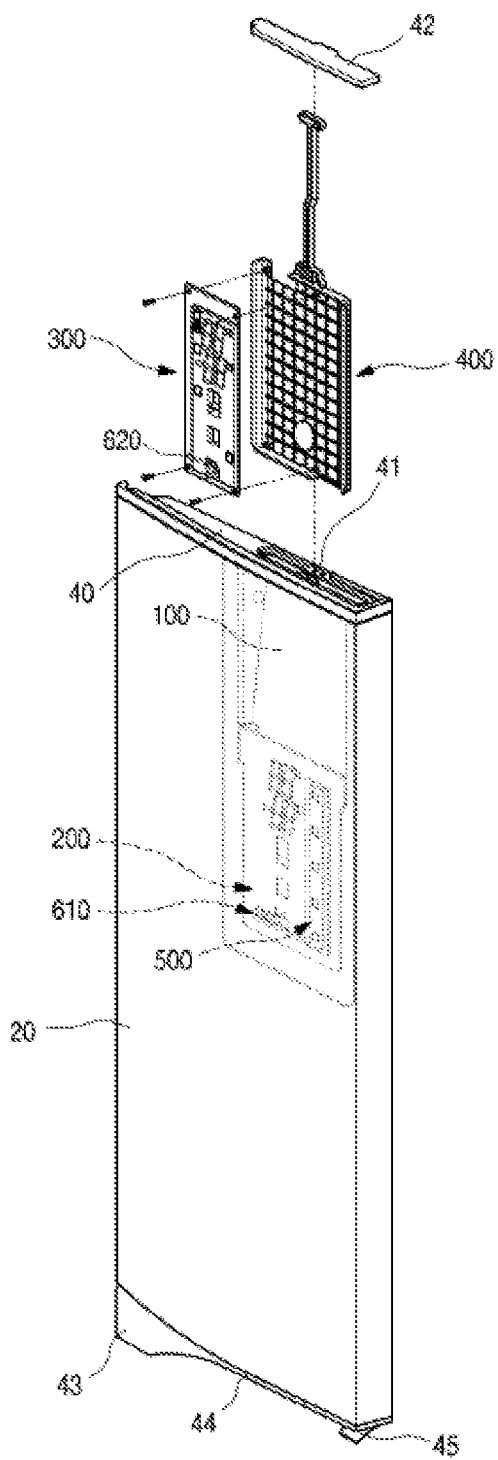
FIG. 5 is an exploded perspective view showing a installation structure of a display assembly in the refrigerator door shown in FIG. 2.
Figure 6:
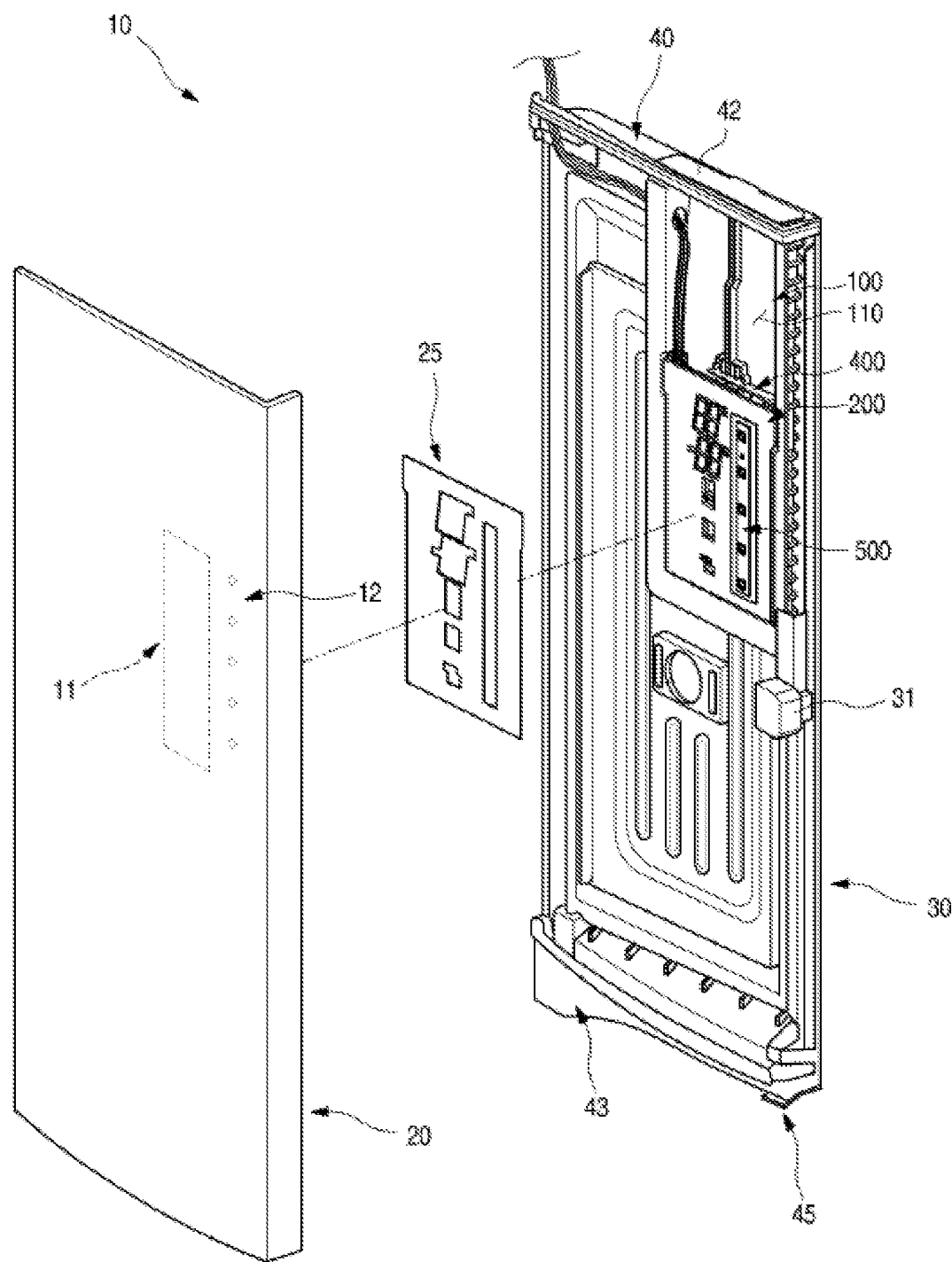
FIG. 6 is an exploded perspective view separated with the front panel of the refrigerator door shown in FIG. 2.

FIG. 5 is an exploded perspective view showing the installed structure of the display assembly in the refrigerator door shown in FIG. 2, and FIG. 6 is an exploded perspective view separated with the front panel of the refrigerator door shown in FIG. 2.

Referring to FIGS. 5 and 6, the door liner 30 forming the rear surface of the refrigerator door 10 is coupled with the external member 20 and forms a surface facing inside the storage space. The door liner 30 may be injection molded with a plastic material and may provide a structure in which a gasket may be arranged along the periphery, or a basket, etc. In addition, the door liner 30 forms a space between the door liner 30 and the external member 20 when the door liner 30 is coupled with the external member 20. In this example, the foamed member forming an insulation material 24 may be filled in the space.

The frame 100 may be attached to the rear surface of the external member 20. The frame 100 provides a separate space inside the refrigerator door 10 which the foaming liquid is not filled and provides the space receiving the display cover 200, the display assembly 300, the touch sensor assembly 500, and the frame display 400, etc.

The decorative members 40, 43 form the upper and lower appearances of the refrigerator door 10 respectively and are coupled to the upper and lower parts or the upper and the lower parts and the side of the refrigerator 10, after the coupling of the door liner 30 with the external member 20, thereby shielding the inner space of the refrigerator door 10.

The decorative member 40 at the upper end of the refrigerator door 10 among the decorative members 40 and 43 is provided with an insertion part 41 and an insertion part cover 42 for opening and closing the insertion part 41. The insertion part 41 penetrates through the decorative member 40 and communicates with the space formed by the frame 100. In addition, the display assembly 300 can be inserted inside the frame 100 through the insertion part 41 while being coupled to the frame display 400 when the refrigerator door 10 is assembled. For this, the insertion part 41 is formed in a size that the frame display 400 can pass through, and can be positioned vertically upper part the display cover 200.

On the other hand, a hinge hole is formed on one side of the decorative member 40, which a hinge as a rotation axis of the refrigerator door 10 is installed. In addition, a wire guided to the inside of the frame 100 through the hinge hole is inserted to supply the power to the electronic components arranged inside the frame 10 or to transmit and receive an operation signal.

The decorative member 43 of the lower part of the refrigerator door 10 may be provided with a door handle 44. The door handle 44 is depressed in the form of a pocket so that it is configured to rotation operate the refrigerator door 10. In addition, the decorative member 43 of the lower part of the refrigerator door 10 is further provided with a lever 45 for opening and closing operations of the refrigerator door 10, and a latch assembly 31 is driven by the operation of the lever 45, thereby opening or closing the refrigerator door 10.

A display cover 200 is attached to the rear surface of the external member 20. The display cover 200 is for guiding the installation of the display assembly 300 on which the plurality of light-emitting devices are mounted and may be attached to the rear surface of the external member 20 by the adhesive layer 25. On one side of the display cover 200, a touch sensor assembly 500 capable of sensing a press operation of the external member 20 by the user installed. The display cover 200 has a structure that can be attached to the external member 20 while being coupled with the touch sensor assembly 500.

Further, the display assembly 300 can be inserted into the space inside the frame 100 through the insertion part 41 while being installed at the frame display 400. The display assembly 300 is positioned inside the display cover 200 in a state in which the frame display 400 is fully inserted and light emitted by the turn-on of the light-emitting device passes through the display cover 200 and the through-hole 21 of the display part 11 to be discharged to the outside.

Figure 7:
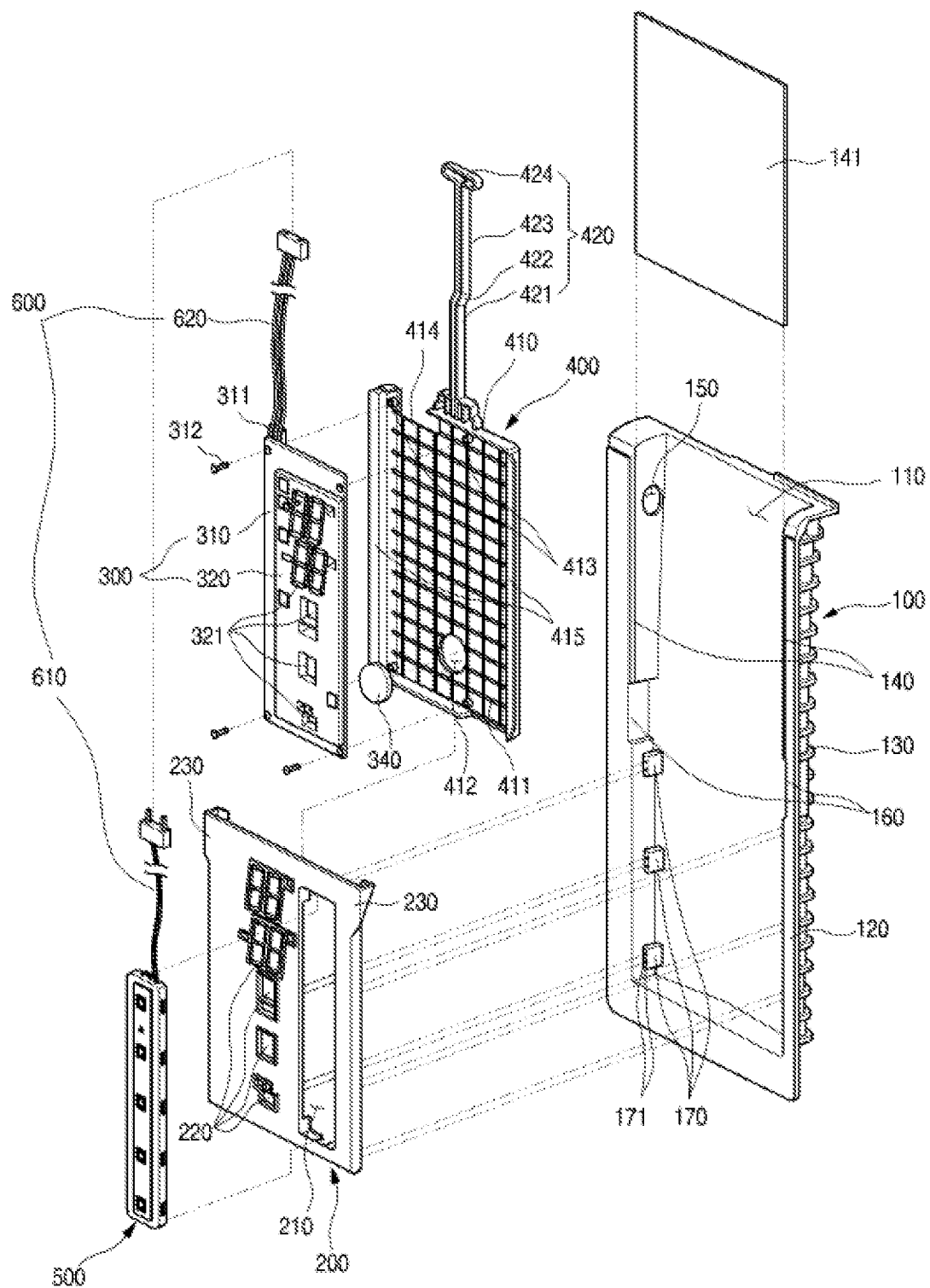
FIG. 7 is an exploded perspective view showing a coupling structure of a touch sensor assembly, a display cover, a display assembly, a frame display, and a frame In accordance with an exemplary implementation of the present invention.

FIG. 7 is an exploded perspective view showing a coupled structure of the touch sensor assembly, the display cover, the display assembly, the frame display, and the frame.

Referring to FIG. 7, the frame 100 is formed so that the front surface and upper surface are opened, and forms a space 110 having an opened upper surface when attached to the external member 20. For this, the periphery of the frame 100 except the upper part is bent toward the external member 20, and the ends thereof is bent outwardly to form the frame adhesion part 120. The frame adhesion part 120 is provided with a double-sided tape or an adhesive so that the frame 100 can be attached to the rear surface of the external member 20.

The upper part contacts with one surface of the decorative member 40 in a state which the frame is attached to the external member 20. The opened upper surface of the frame 100 may be communicated with the insertion part 41 and forms an independent space inside the refrigerator door 10. Accordingly, even when the foaming liquid for forming the insulating material 24 is injected into inside the refrigerator door 10, the foaming liquid does not flow into the space inside the frame 100.

In addition, the plate supporting part 140 on which the support plate 141 is seated are provided on both sides of the upper part of the frame 100. The support plate 141 is installed on the upper part of the display cover 200 in a state which the display cover 200 is installed to support the external member 20 from the rear. Accordingly, the shape of the external member 20 can be prevented from being deformed by an external impact, etc.

A wire entrance part 150 is provided at the upper side of the frame 100. The wire entrance part 150 forms a passage through the wire connecting the electronic components provided inside the frame 100 and the power part on the cabinet enter and exit. The wire entrance 150 may be formed at the region adjacent to the hinge of the refrigerator door 10 and may be arranged adjacent to the hinge hole of the refrigerator door 10.

On both right and left sides of the frame 100, a confined groove 160 is provided. The confined groove 160 is provided such that a confined part 230 is protruded from both ends of the display cover 200.

A cover supporting part 170 for supporting the display cover 200 is provided at a position where the display cover 200 is positioned at the lower part of the confined groove 160. The cover supporting part 170 protrude from both left and right sides of the frame 100 to press and support both side ends of the display cover 200 from the rear.

The display cover 200 is formed of a plate type plastic material and is provided to be received inside the frame 100 in a state of being attached to the external member 20. In addition, a confined part 230 protruding outwardly and inserted into the confined grooved 160 is provided at the upper part of both side ends of the display cover 200. In addition, the display cover 200 further includes a receiving part 210 to which the touch sensor assembly 500 is installed.

The display cover 200 includes a plurality of guide holes 220 at positions corresponding to the display part 11. The guide hole 220 is provided at a position corresponding to the through-hole 21 when the display cover 200 is attached to the rear surface of the external member 20. That is, the display cover 200 is arranged with the plurality of guide holes 220 of guiding light penetrating the display cover 200 at the predetermined region corresponding to the plurality of the light-emitting device arranged at the display assembly 300 and emitted from the light-emitting device, to the through-hole or the unit set (the segment) including the plurality of the through-holes 21.

The guide hole 220 communicates the light-emitting device with the through-hole 21 to guide light emitted from the at least one light-emitting device arranged in the display assembly 300 into a segment and the guide hole 220 may be formed with the shape corresponding to the segment.

The display assembly 300 includes a substrate 310 on which a plurality of light-emitting devices are mounted and a reflector 320 arranged on a front surface of the substrate 310. The substrate 310 includes a control part for driving a plurality of light-emitting devices, and a sensor control part for the driving the touch sensor assembly 500 is mounted. The sensor control part processes an operation signal of the external member 20 sensed through the touch sensor assembly 500 on the substrate 310. For this, the substrate 310 and the sensor PCB (not shown) inside the touch sensor assembly 500 are connected to through connection means such as a cable connector 600.

The cable connector 600 includes a first cable connector 610 connected to the sensor PCB inside the touch sensor assembly 500 and a second cable connector 620 connected to the substrate 310. The first cable connector 610 and the second cable connector 620 may be connected to each other. In addition, The first cable connector 610 and the second cable connector 620 may be connected to each other from the outside the refrigerator door 10 in the process of installing the display assembly 300 on the refrigerator door 10. The overall length of the cable connector 600 is formed to be longer than the distance from the touch sensor assembly 500 to the insertion part 41 to install the display assembly 300 after connecting to each other from the outside the insertion part 41 in a state which the touch sensor assembly 50 is installed at the display cover.

The front surface of the substrate 310 is provided with the reflector 320 for guiding light emitted from the light-emitting device towards the guide hole 220 of the display cover 200 and the through-hole 21 of the external member 20. The reflector 320 not only guides light emitted from the light-emitting device but also make the substrate 310 and the display terminal 311 to be spaced apart from the external member 20 by the thickness of the reflector 320 itself. Accordingly, it is possible to prevent the substrate and the various electronic components mounted on the substrate 310 from being damaged by a static electricity generated from the outside.

Particularly, when the external member 20 is formed of the stainless steel material and the display assembly 300 is arranged adjacent to the display part 11, the static electricity can be easily generated during use of the home appliance. Thus, when the substrate 310 and the external member 20 are structurally spaced apart by the reflector 320, the protection of the substrate 310 can be promoted. In addition, the reflector 320 may be formed of a light reflective material or may be coated with a light reflective material at least on its inner circumferential surface to reflect light emitted in various directions from light reflective element, such that it is not lost while reaching the guide hole 20 of at least the display cover.

The reflector is provided with the auxiliary through-hole 321 corresponding to the position of the light-emitting device mounted on the substrate 310 which can communicate with the guide hole 220 of the cover 200 and the through-hole 21 of the external 20. The frame display 400 is installed on the display cover 200 in a state the display assembly 300 is installed and the through-hole 21, the guide hole 220 and the auxiliary through-hole 321 are closely attached without spaced so that they have a structure communicating to each other. Accordingly, light emitted from the light-emitting device can be emitted to the outside without being lost from inside the external member (20).

The frame display 400 is provided with a edge 410 which has the plate type structure for installing the substrate 310 and bent forward along the periphery of the frame display 400, and forms a space which the substrate 310 is received. Both side ends of the frame display 400 are also provided with a sliding insertion part 415 which is bent in a lateral direction and is inserted inward a guide rails 240 provided on the display cover 200. Accordingly, the frame display 400 is installed on the display cover 200 by the sliding insertion part.

In addition, a frame handle 420 which extends upwardly is provided at a center part of the upper end of the frame display 400. The frame handle 420 is a part for the user to grab and operate when the frame display 400 is coupled to the display cover 200 and has an appropriate length for the user to grip. When the insertion part cover 42 is closed in a state which the frame display 400 is fully inserted, the insertion part cover 42 contacts with the frame handle 420.

Figure 8:
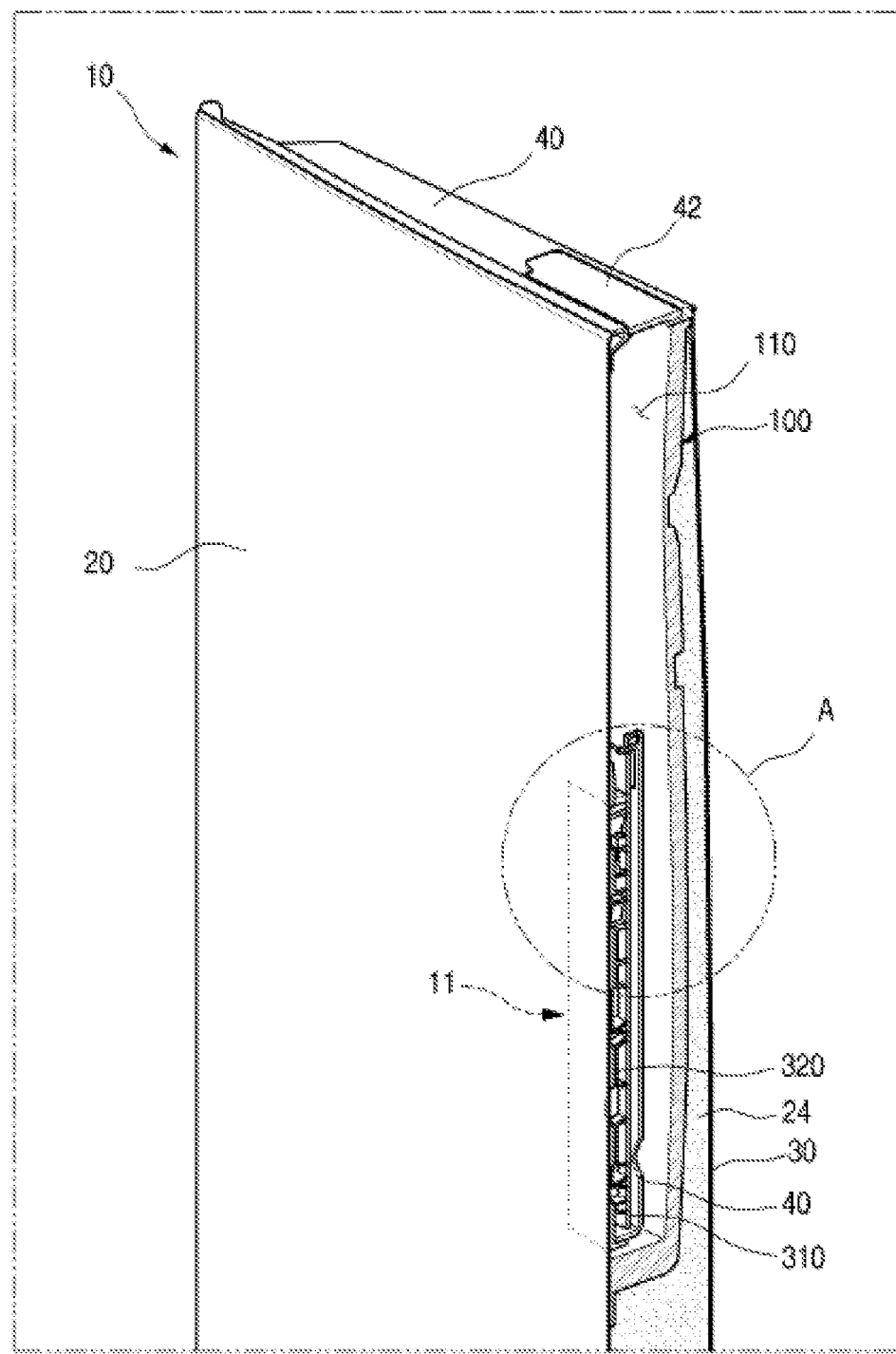
FIG. 8 is a cross-sectional view of the refrigerator door taken along the cutting line 12-12' of FIG. 2
Figure 9:
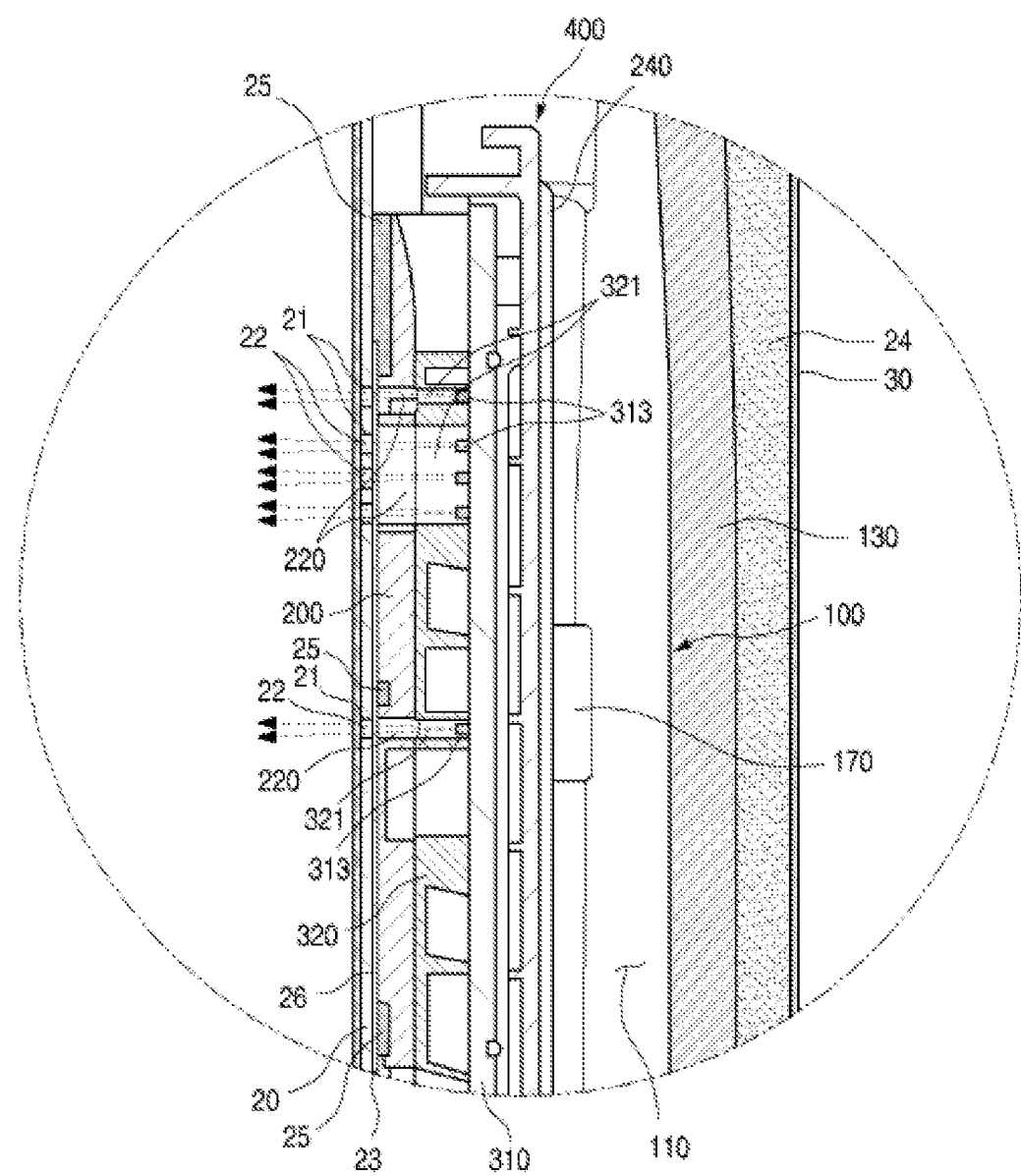
FIG. 9 is a cross-sectional view shown by enlarging the region A of FIG. 8.
Figure 10:
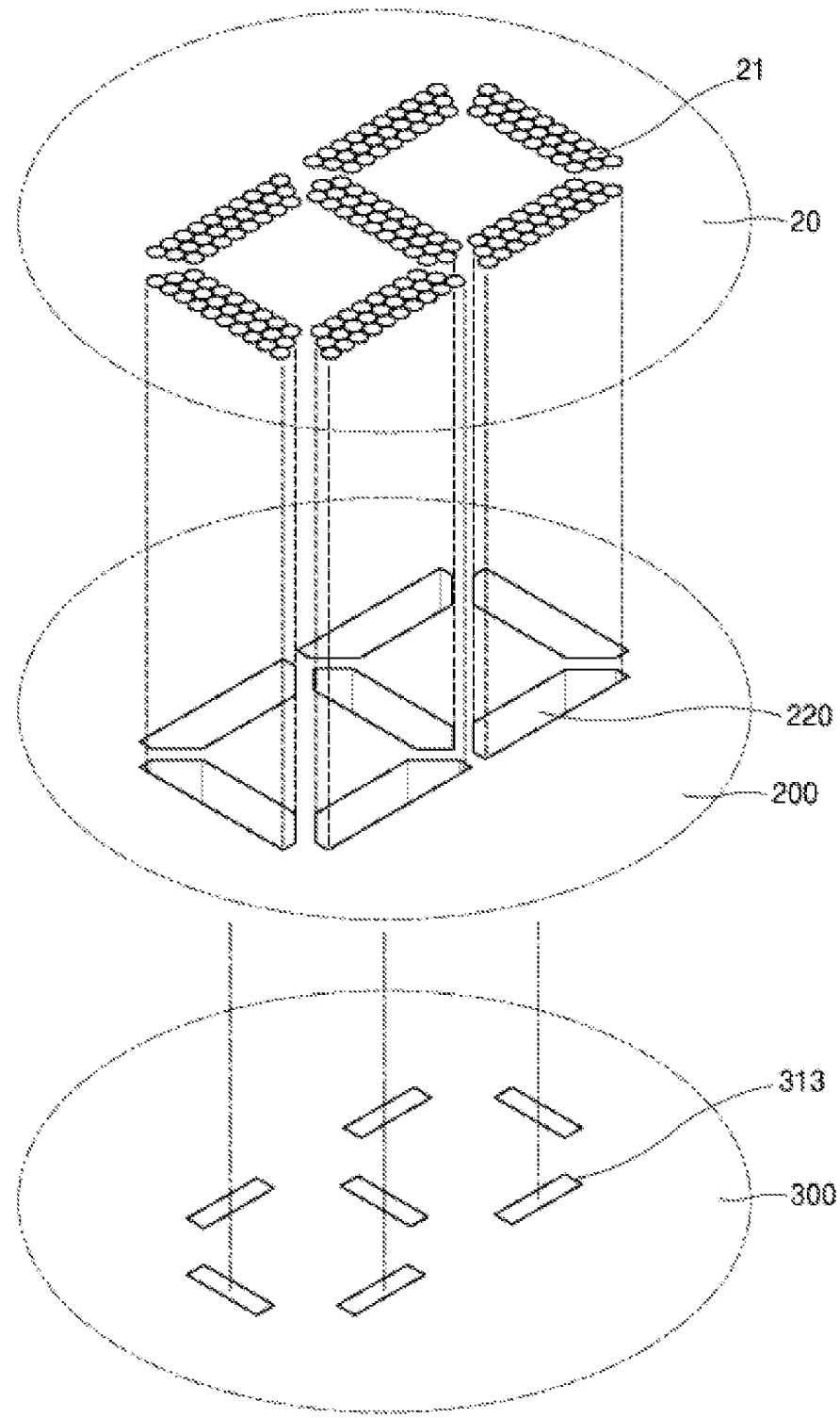
FIG. 10 is an exploded perspective view schematically showing a relationship between the external member (the front surface panel) for home appliances, the display cover, and the display assembly in accordance with an exemplary implementation of the present invention.

FIG. 8 is a cross-sectional view of the refrigerator door cut along a cutting line 12-12' of FIG. 2 and FIG. 9 is a cross-sectional view shown by enlarging region A of FIG. 8, and FIG. 10 is an exploded perspective view schematically showing the relationship of the external member for home appliances, the display cover, and the display assembly in accordance with an exemplary implementation of the present invention.

Referring to FIGS. 8 to 10, the through-hole 21 and the guide hole 220 have the structure communicated with each other in a state which the display cover 200 is attached to the rear surface of the external member 20 by the adhesive member 25. Here, the guide hole 220 serves to guide light emitted from the light-emitting device 313 to the through-hole 21. At this time, the size of the through-hole 21 is formed to be smaller than that of the guide hole 220 so that the plurality of through-holes 21 are arranged inside region of one guide hole 220, and the plurality of through-holes 21 arranged in the inner region of one guide holes 220 may form one segment. Accordingly, when the light-emitting device 313 arranged on the rear surface of the guide hole 220 is turned on, the guide hole 220 guides uniformly light emitted from the light-emitting device 313 into the plurality of through-holes 21 forming one segment, the segment displayed on the external member 20 may improve the display quality The auxiliary through-hole 321 is communicated such that the guide hole 220 each other in a state which the frame display 400 is completely inserted and the display assembly 300 is positioned inside the display cover 200. Preferably, the guide hole 220 and the auxiliary through-hole 321 are formed to have the same size and the reflector 320 is closely attached to the rear surface of the display cover 200 so that the guide hole 220 and the auxiliary through-hole 321 are completely overlapped with each other.

Accordingly, the auxiliary through-hole 321, the guide hole 220, and at least one, and preferably, a plurality of the through-holes 21 are all communicated with closely contacted. Light emitted from the light-emitting device 313 passes through the auxiliary through-hole 321, the guide hole 220, and the through-hole 21 sequentially in a state which light loss is minimized, and is discharged to the outside the refrigerator door 10.

According to another variation of the invention, it is also possible for the external member 20 to be attached to the front face of the reflector 320 by replacing the role of the display cover 200 by the reflector 320 of the display assembly 300. At this time, an insulating layer may be further provided between the external member 20 and the reflector 320 to prevent the static electricity from being generated between the external member 20 and the reflector 320.

Figure 11:
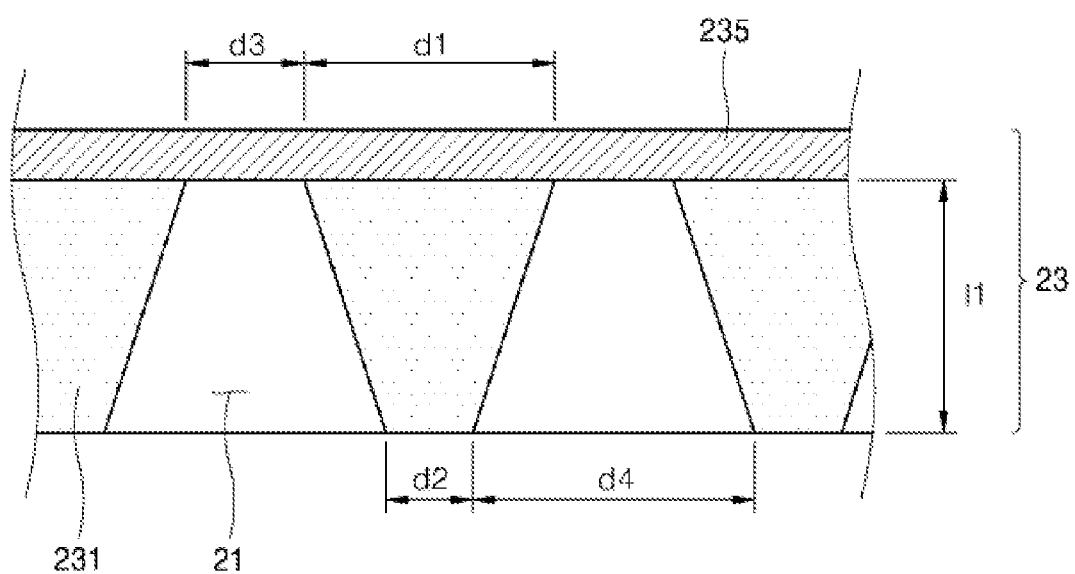
FIG. 11 is a cross-sectional view of the external member (the front panel) for home appliances in accordance with an exemplary implementation of the present invention cut along the cutting line 8-8' in FIG. 4, and FIG. 12 and FIG. 13 are cross-sectional views of the external member (the front surface panel) for home appliances according to the exemplary implementation of the present invention.
Figure 12:
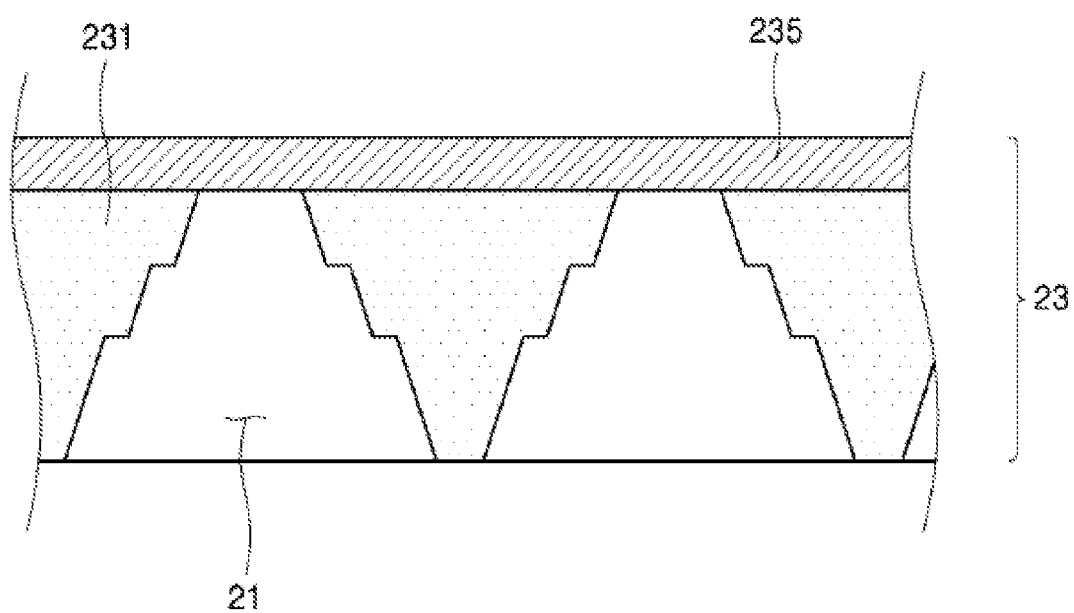
Figure 13:
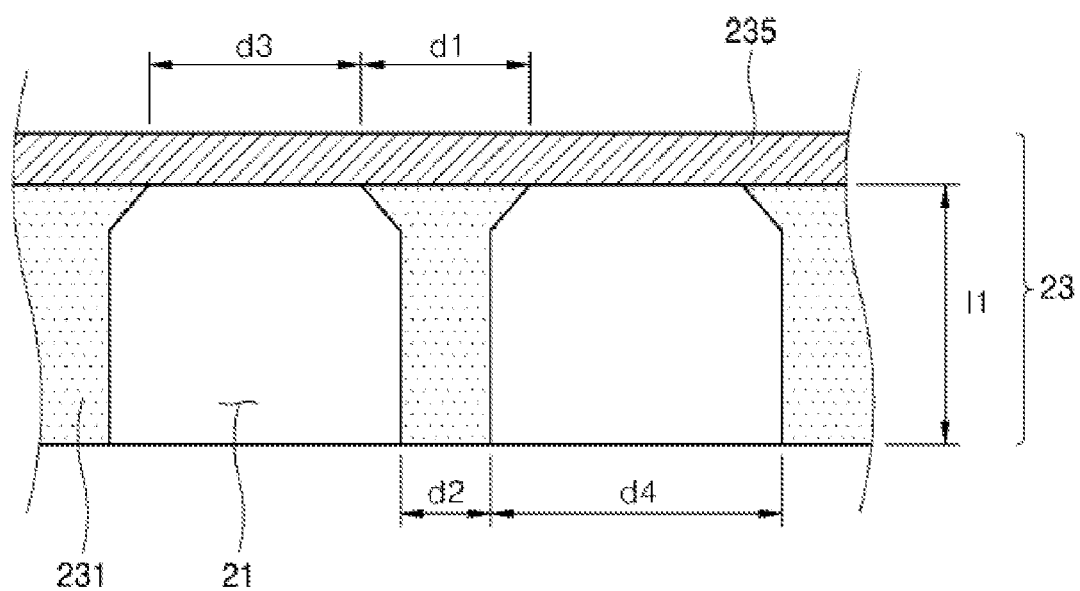

FIG. 11 is a cross-sectional view of an external member (the front panel) for home appliances in accordance with an exemplary implementation of the present invention cut along the cutting line 8-8' in FIG. 4, and FIG. 12 and FIG. 13 are the cross-sectional views of the external member (the front panel) for home appliances in accordance with another implementation of the present invention.

Referring to FIGS. 11 to 13, a metal layer 231 is provided with the plurality of through-holes 21 at the predetermined region corresponding to the plurality of the light-emitting device arranged to the display assembly positioned at the rear surface of the metal layer 231, in the steel plate 23 attached with the film layer 235 implementing the color or the texture of the front appearance of the home appliance at the front surface of the metal layer 231.

At this time, the distance d1 between the front openings of two neighboring through-holes 21 from each other can be secured to be at least 0.1 mm or more, preferably 0.2 mm or more, and more preferably 0.3 mm to 1.0 mm. Here, it is preferable that the thickness 11 of the metal layer 231 is 0.1 mm to 0.5 mm in consideration of the accuracy, etc. in the etching process for forming the through-hole 21.

When the distance d1 between the front openings of two neighboring through-holes 21 from each other is less than 0.2 mm, the distance d1 between the front openings is too close and light is discharged from the outside through the two through-holes 21, there is a problem that the distinction between the two through-holes 21 may become unclear. In addition, since the distance d1 between the front openings is too narrow, the defects may occur in which two neighboring through-holes 21 are connected to each other in the process of forming the through-holes 21. On the other hand, when the distance d1 between the front openings of the two neighboring through-holes 21 from each other exceeds 0.7 mm, the distance between the two through-holes 21 is too large, there is a problem that the quality of the segment displayed by the through-hole 21 is degraded.

In addition, the distance d2 between the rear openings of the two neighboring through-holes 21 from each other can be secured to be at least 0.01 mm or more, preferably 0.05 mm or more to 0.5 mm.

When the distance d2 between the rear openings of two neighboring through-holes 21 from each other is less than 0.05 mm, the distance d2 between the rear openings is too narrow. Therefore, in the process of forming the through-holes 21, the defect which two neighboring through-holes 21 from each other are connected to each other. On the other hand, when the distance d2 between the rear openings of two through-holes 21 neighboring to each other exceeds 0.5 mm, in order to secure the proper distance d1 between the front openings of the two through-holes 21, there is a problem in that the size of the through-hole 21 becomes unnecessarily large.

In addition, according to the present invention, the through-hole 21 is formed by penetrating the metal layer 231 such that the width of the front surface opening formed on the front surface of the metal layer 231 is different from that of the rear surface opening formed on the rear surface of the metal layer 231.

At this time, it is preferable that the width d3 of the front opening formed on the front surface of the metal layer 231 is smaller than that of the width d4 of the rear surface opening formed on the rear opening of the metal layer 231. Here, the width d3 of the front surface opening formed on the front surface 231 may be 0.2 mm to 0.6 mm, and the width d4 of the rear opening formed on the rear surface of the metal layer 231 may be 0.3 mm to 0.7 mm.

As the through-hole 21 penetrating through the metal layer 231 is formed to have the width d3 of the front opening smaller than the width d4 of the rear opening, the front opening and the rear opening of the through-hole 21 do not exactly coincide with each other. Accordingly, when viewed from the outside, it can prevent light from being emitted in a different form from the shape of the front opening or light from being emitted irregularly.

In addition, the through-hole 21 penetrating the metal layer 231 may have a tapered shape or a stepped shape in which the width is narrower from the rear surface to the front surface of the metal layer 231. According to another variation, the through-hole 21 vertically penetrates the metal layer 231, and as the width of the through-hole 21 is narrower in the region adjacent to the film layer 235, consequently, it may have the shape which the width of the front opening formed on the front surface of the metal layer 235 is smaller than that of the opening formed on the rear surface of the metal layer. As such, the width of the through-hole 21 is not constant along the thickness direction of the metal layer 231 and the width of the opening formed on the front surface is smaller than that of the rear surface of the metal layer 231, and thus, the permeable ink layer 22 can be effectively filled without forming an empty space in the through-hole 21 by the ink layer 22 because the ink layer 22 is less influenced by the viscosity of the ink layer 22 when filling the through-hole 21. In addition, by increasing the inner circumferential surface of the through-hole and the contact area of the ink layer 22 compared to the case that the through-hole 21 penetrates the metal layer 231 vertically and increases the friction between the through hole 21 and the ink layer 22, and accordingly, it is possible to prevent the problem which the ink layer 22 is leaked or deviated from the through-hole.

Figure 14:
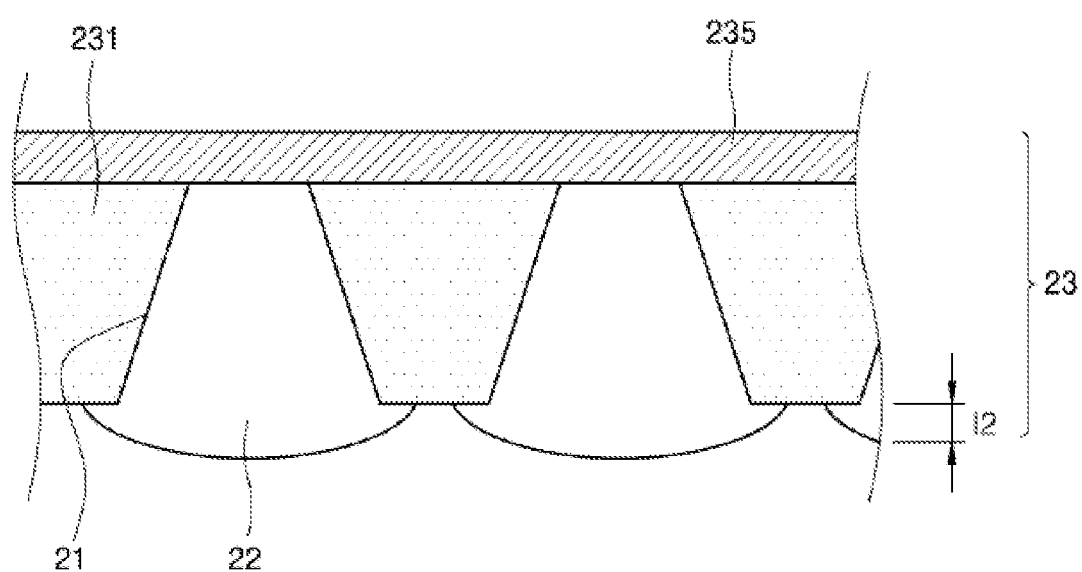
FIG. 14 is a cross-sectional view showing a state in which an ink layer is filled in the external member (the front panel) for home appliances shown in FIG. 11 in accordance with an exemplary implementation of the present invention and FIG. 15 is a cross-sectional view showing a state in which the ink layer is filled in the external member (the front surface panel) shown in FIG. 11 according to other implementation of the present invention.
Figure 15:
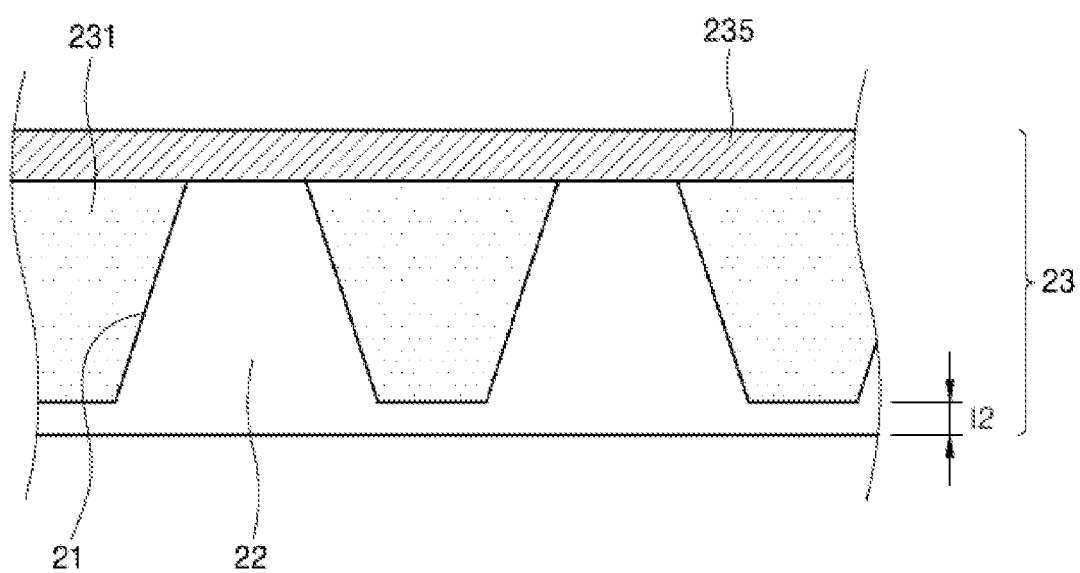

FIG. 14 is a cross-sectional view showing a state in which an ink layer is filled in the external member (the front panel) for home appliances shown in FIG. 11 in accordance with an exemplary implementation of the present invention, and FIG. 15 is a cross-sectional view showing a state which the ink layer is filled at the external member (the front panel) for home appliances show in FIG. 11 in accordance with an exemplary implementation of the present invention.

Referring to FIGS. 14 and 15, the ink layer 22 may be printed to be protruded from the rear opening of the through-hole 21 by a predetermined height 12. Further, in another implementation, the ink layer 22 may be printed to cover a particular part of the rear surface of the metal layer 231 while filling the through-hole 21. At this time, the ink layer 22 has a convex shape from the rear surface of the metal layer 231 so that it may reduce that the ink layer 22 is leaked or deviated from the through-hole 21 by the contact or the friction of the ink layer 22 and other member. In particular, since the ink layer 22 covers the particular region of the rear surfaces of the metal layer 231 simultaneously, the contact area with the metal layer is increased, thereby supporting the ink layer 22 in the through-hole 21 stably.

That is, the ink layer 22 is protruded from the rear opening of the through-hole 21 by a predetermined height or is protruded from the rear opening by a predetermined height, and, at the same time, covers a particular region of the rear surface of the metal layer 231, it is possible to prevent the ink layer 22 from being incompletely filled in the through-holes 21. In addition, it can perform the function as the guide of light transmitted toward the through-hole 21 from the light-emitting device.

Particularly, even when the inner circumferential surface or the rear surface opening of the through-hole 21 is not smoothly etched in the etching process for forming the through-hole 21, since the ink layer 22 can be over-filled, it is possible to prevent the quality of light transmittance from being degraded by the ink layer 22 which filling the through-hole 21 incompletely.

It is also possible to prevent the rear surface of the metal layer 231 from being corroded by contacting with the air or the moisture, by covering the rear surface of the metal layer 231 while filling the through-hole 21 with the ink layer.

It is preferable that the height 12 at which such ink layer 22 protrudes is at least 0.1 mm or less in order to prevent an excessive spacing from being generated from the display cover attached to the rear surface of the steel plate 23.

Figure 16:
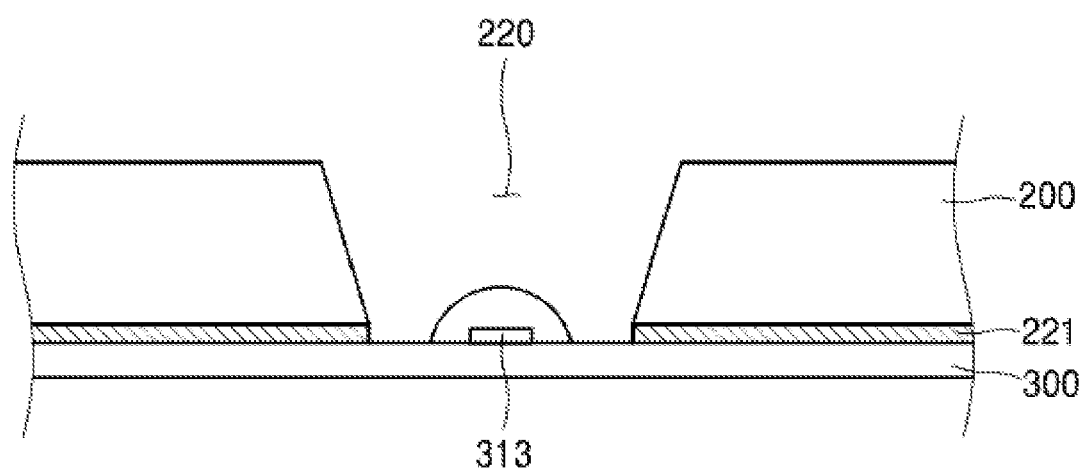
FIG. 16 is a cross-sectional view showing a state in which the display cover and the display assembly in accordance with an exemplary implementation of the present invention are coupled.
Figure 17:
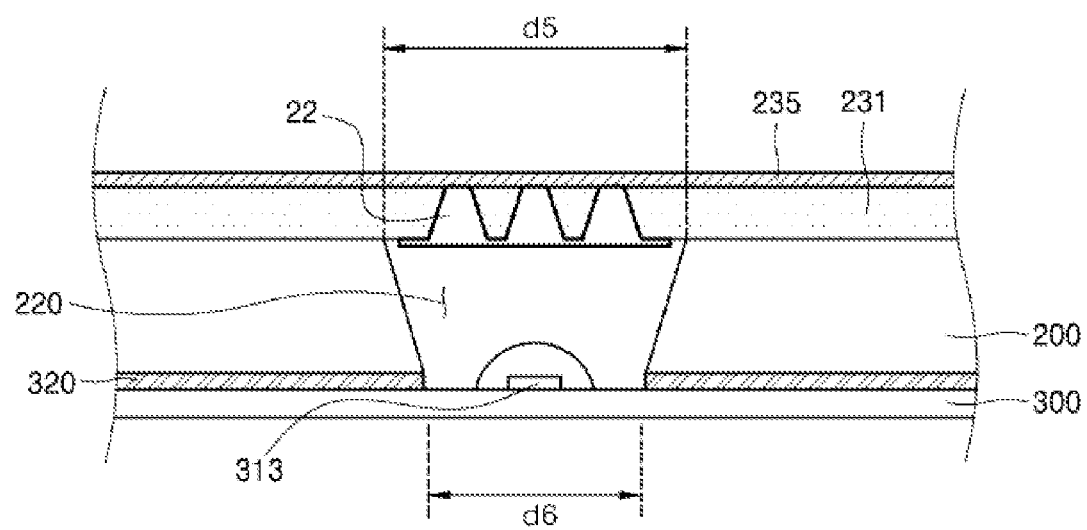
FIGS. 17 to 19 are the cross-sectional views showing a state in which the external member (the front panel) for home appliances, the display cover, and the display assembly according to various implementations of the present invention are coupled.
Figure 18:
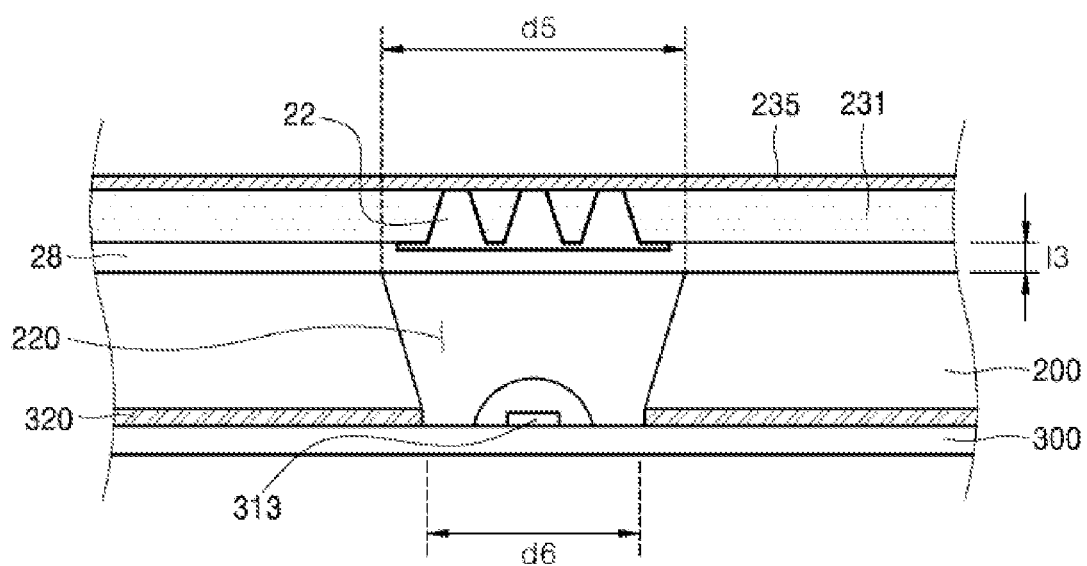
Figure 19:
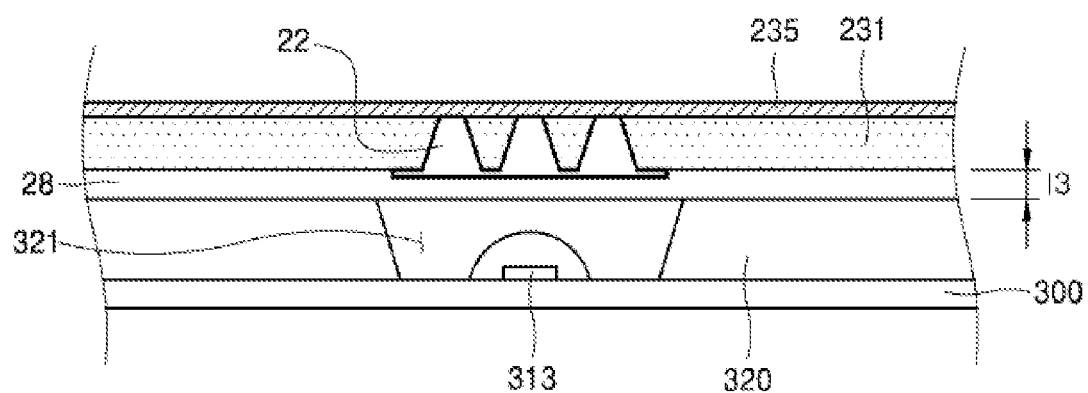

FIG. 16 is a cross-sectional view showing a state in which a display cover and a display assembly in accordance with an exemplary implementation of the present invention are coupled, and FIGS. 17 to 19 are the cross-sectional views showing the external member (the front panel) for home appliances, the display cover, and the display assembly in accordance with various implementations of the present invention.

First, referring to FIG. 16, a display cover 200 is attached to the front surface of the display assembly 300 on which the light-emitting device 313 is mounted. The display cover 200 and the display assembly 300 may be firmly attached to each other via an adhesive member 221 such as double-sided tape, etc. At this time, the spacing between the display cover 200 and the display assembly 300 is 0.5 mm or less, preferably 0.3 mm or less, and more preferably 0.1 mm or less, in order to prevent light emitted from the light-emitting device 313 through between the display cover 200 and the display assembly.

Referring to FIG. 17, a film layer 235 to implement the color or the texture of the front surface of the home appliance is attached to the front surface of the metal layer 231. The metal layer 231 is provided with the plurality of through-holes 21 at the predetermined region corresponding to the plurality of the light-emitting devices 313 mounted on the display assembly 300 positioned on the rear surface of the metal layer 231. The plurality of through-holes 21 is respectively filled with the ink layer 22. The display assembly 300 is also provided with a reflector 320 for structurally spacing apart the display assembly 300 from the display cover 200 and the external member 20. The reflector 320 may be formed of a light reflective material or at least the inner circumferential surface thereof may be coated with a light reflective material to reflect light emitted in various directions from the light-emitting device 313 such that light is not lost while reaching the guide hole 220 of the display hole 200. For this, the reflector 320 corresponds to the mounting position of the light-emitting device 313, and includes am auxiliary through-hole which can communicate with the guide hole 220 of the display cover 200 and the through-hole 21 of the external member 20.

Between the metal layer 231 and the display assembly 300, the display cover 200 of the plastic material is interposed, not only for preventing the static electricity but also for securing a light path that can uniformly reach the plurality of through-holes 21 by diffusing light emitted from the light-emitting device 313. The spacing of the metal layer 231 and the display cover 200, the display cover 200 and the display assembly 300 may be 0.5 mm or less, preferably 0.3 mm or less, more preferably 0.1 or less in order to prevent light emitted from the light-emitting device 313 from being leaked through between the metal layer 231 and the display cover 200, the display cover 200 and the display assembly 300.

The display cover 200 is provided with a plurality of through-holes 21 at the front surface and a guide hole 220 at a position corresponding to the light-emitting device 313 at the rear surface. The guide hole 220 serves to guide light emitted from the light-emitting device 313 mounted on the display assembly 300 to transmit the print layer 22 filled in the plurality of through-holes 21.

At this time, the inner circumferential surface of the guide hole 220 is coated with a reflective material and reflects light passing through the guide hole 220 in various directions, and it is possible to reduce the loss of the light.

Here, it is preferable to penetrate at least display cover 200 vertically in order to reduce the loss of light passing through the guide hole 220. In addition, the width d5 of the front opening of the guide hole 220 is greater than the width d6 of the rear opening, thereby preventing light from being reflected unnecessarily or being lost at the rear opening side.

Referring to FIG. 18, a light diffusion sheet 28 may be attached between the metal layer 231 and the display cover 200.

The light diffusing sheet 28 diffuses light transmitted from the light-emitting device 313 and disperses light passing through the through-hole 21 evenly so as to improve the brightness of the displayed numbers, letters, figures, or the symbols, etc. Further, by providing the light diffusion sheet 28, it is possible to provide a sufficient light diffusion effect even when the light path is short, which is advantageous in that the thickness of the display cover 200 can be made thinner. It is preferable that the light diffusion sheet 28 have the thickness of 0.5 mm or less in order to prevent light emitted from the light-emitting device 313 being leaded through between the metal layer 231 and the display cover 200.

Further, referring to FIG. 19, it is possible to have the structure to form the reflector 320 thicker than the example shown in FIGS. 17 and 18, and to omit the display cover 200. The light path shortened by omitting the display cover 200 may be sufficiently compensated by the light diffusion sheet 28.

Figure 20:
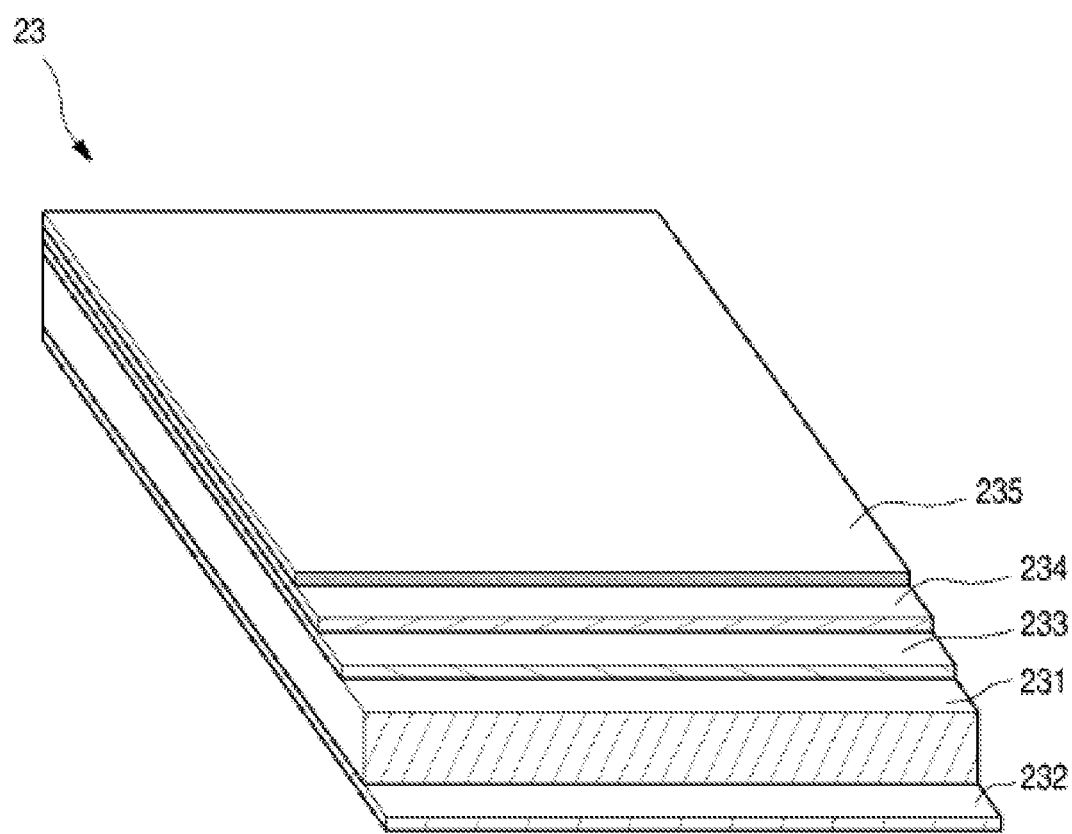
FIG. 20 is a cut-away perspective view of an external member (the front panel) for home appliances in accordance with an exemplary implementation of the present invention.

FIG. 20 is an exploded perspective view of an external member (the front panel) for home appliances in accordance with an exemplary implementation of the present invention.

The steel sheet 23 used in the external member shown in FIG. 20 may be provided in a VCM type using a film layer to implement the color or texture of the front appearance of the home appliance or a PCM type using the coating layer.

Hereinafter, an example of a VCM type steel plate will be described.

As described above, the external member 20 includes the light-transmitting film layer 235 as well as implementing the color or the texture of the front face of the home appliance, and a steel plate 23 covering the display assembly 300 which is attached to the rear surface of the film layer 235 and attached with the plurality of the light-emitting devices.

Here, the steel plate 23 may mean a molten galvanized steel sheet GI or an electro-galvanized steel sheet EGI itself, or mean a form including the pre-treatment layer 233 which is chemically washed (acid or base treatment) or coating treated based on the metal layer 231 corresponding to the molten galvanized steel sheet GI or the electro-galvanized steel sheet EGI, a primer layer 234 as the adhesive layer, and the film layer 235.

The film layer 235 to implement the color or texture of the front surface of the home appliance is attached to the front surface of the primer layer 234 and the back coating layer for preventing the contamination such as the corrosion of the metal layer 231 into the rear surface of the metal layer 231 is formed. Here, the back coating layer 232 forms the rear surface of the external element 20, and contacts with the insulation material 24 filled inside the refrigerator door 10, thereby preventing the metal layer 231 from being contacted with the moisture or the air.

Accordingly, in order to form the through-hole 21 in the metal layer 231, after exposing the rear surface of the metal layer 231 by removing a part of the back coating layer 232 formed on the rear surface of the metal layer 231, it is necessary to perform the etching at the predetermined region.

Then, when the etching of the metal layer 231 is completed and the through-hole 21 is formed, the light transmitting ink layer 22 is printed on the rear surface of the metal layer 231 on which the through-hole 21 is arranged, and thus, the empty space formed by the through-hole 21 is filled. The ink layer 22 prevents the contamination of the inside surface of the through-hole 21 by preventing the inside surface of the through-hole 21 from being contacted with the air or the moisture, and performs the function of supporting the film layer 235 of shielding the front opening at the rear surface.

It is also possible for the ink layer 22 to simultaneously perform the role of the back coating layer 232 by printing in order to cover the region from which the back coating layer 232 is removed from the rear surface of the metal layer 231.

In accordance with an exemplary implementation of the present invention, the PVC-type and PVC-free type film layer 235 may be used for the external member 20 provided as the VCM type.

Figure 21:
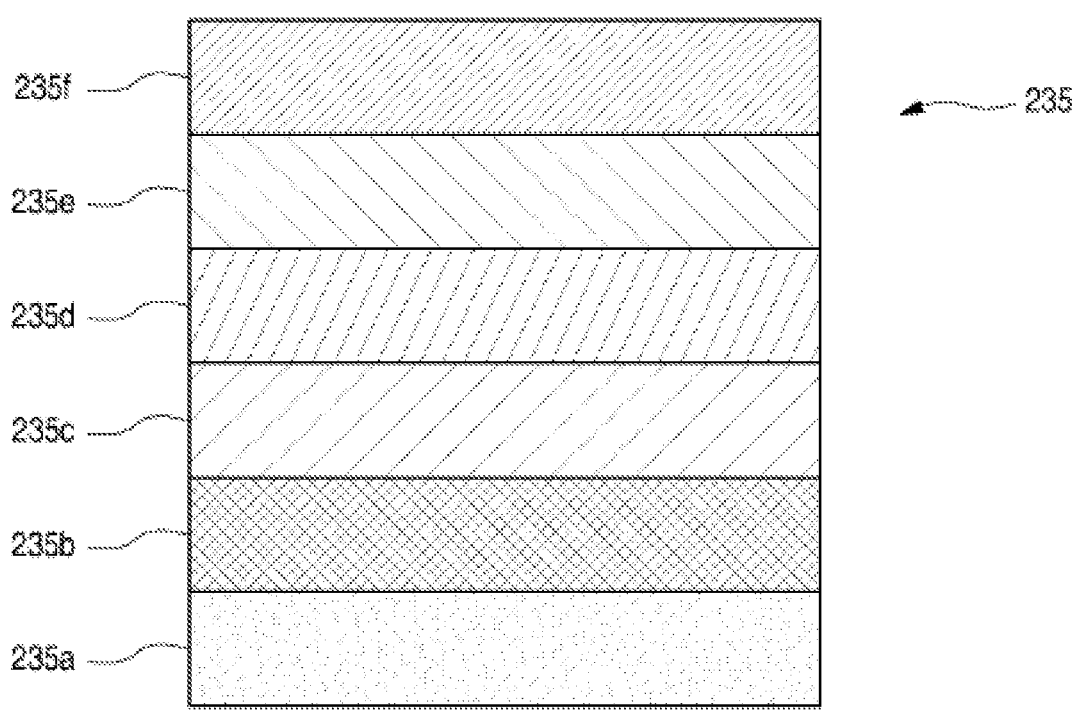
FIGS. 21 and 22 are the cross-sectional views of the film layer of FIG. 20.
Figure 22:
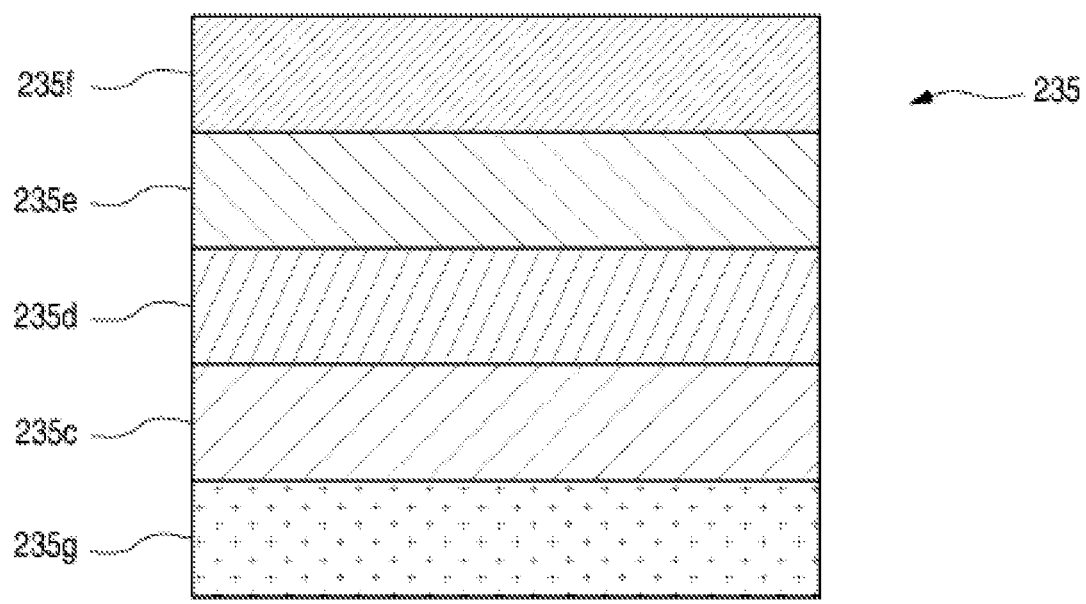

FIGS. 21 and 22 are the cross-sectional views of a film layer used in an external member (the front panel) for home appliances provided as the VCM type of FIG. 20.

FIG. 21 is a PVC-free type film layer 235 and has a structure which the first adhesive layer 235a contacting the metal layer 231, or selectively the pre-treatment layer 233 or the primer layer 234, the coating layer 235b of determining the color of the front appearance of the home appliance, the thin metal film layer 235d, and the pattern layer 235f of determining the texture of the front appearance of the home appliance are sequentially deposited or attached.

The film layer 235 optionally includes a primer layer 234 or an adhesive layer 235a and both layers serve to securely adhere the metal layer 231 and the remaining layers of the film layer 235. As the first adhesive layer 235a, various heat or photo-curable resin based adhesive may be used.

The coating layer 235b is a resin layer optionally including a coating for determining the color of the front surface of the home appliance. When the coating is not included, the color of the front surface of the home appliance will be determined by the thin metal film layer 235d. The film layer 235 may optionally include a thin metal film layer 235d, and, when the thin metal film layer 235d is included, the adhesive layer 235c, 235e may be arranged between the coating layer 235b and the meal thin film 235d, or the thin metal layer 235d and the pattern layer 235f, for the secure adhesion between the thin metal film layer 235d and the other layers.

In addition, when it is desired to impart a specific texture to the front appearance of the home appliance, a pattern layer 235f imprinted with various patterns such as saffiano, a hairline, etc. may be attached to the front surface of the thin metal film layer 235d.

The pattern layer 235f may be provided by imprinting the pattern on at least one surface selected from the front and back surfaces of the PET film, and when the patterns are imprinted on both the front surface and the back surface, the pattern which is identical to each other or different from each other may be imprinted on the front and rear surfaces.

For example, it is possible to imprint the saffiano pattern that provides a tactile sense such as a leather on the front surface and imprint the hairline pattern on the rear surface to implement a sense of luxuriousness and aesthetic sensibility that can be provided through various senses.

FIG. 22 is a PVC type film layer 235 and has a structure which a PVC layer 235g in contact with the metal layer 231 or optionally the pre-treatment layer 233 or the primer layer 234, the thin metal film layer 235d, and a pattern layer 235f for determining the texture of the front appearance of the home appliance are sequentially deposited or attached.

The PVC layer 235g may optionally include a coating to determine the color of the front appearance of the home appliance, and, when the coating is not included, the color of the front appearance of the home appliance may be determined by the metal film layer 235d.

Figure 23:
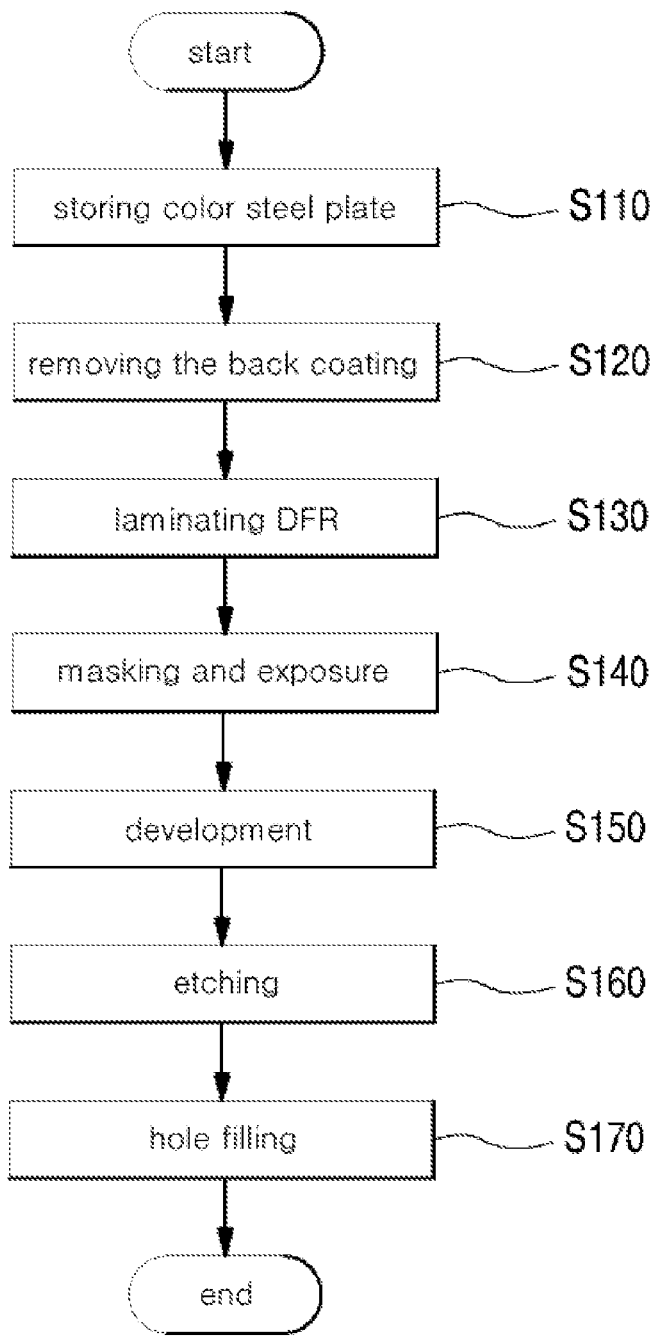
FIGS. 23 and 24 show a sequence of the method of manufacturing an external member (the front panel) for home appliances in accordance with an exemplary implementation of the present invention.
Figure 24:
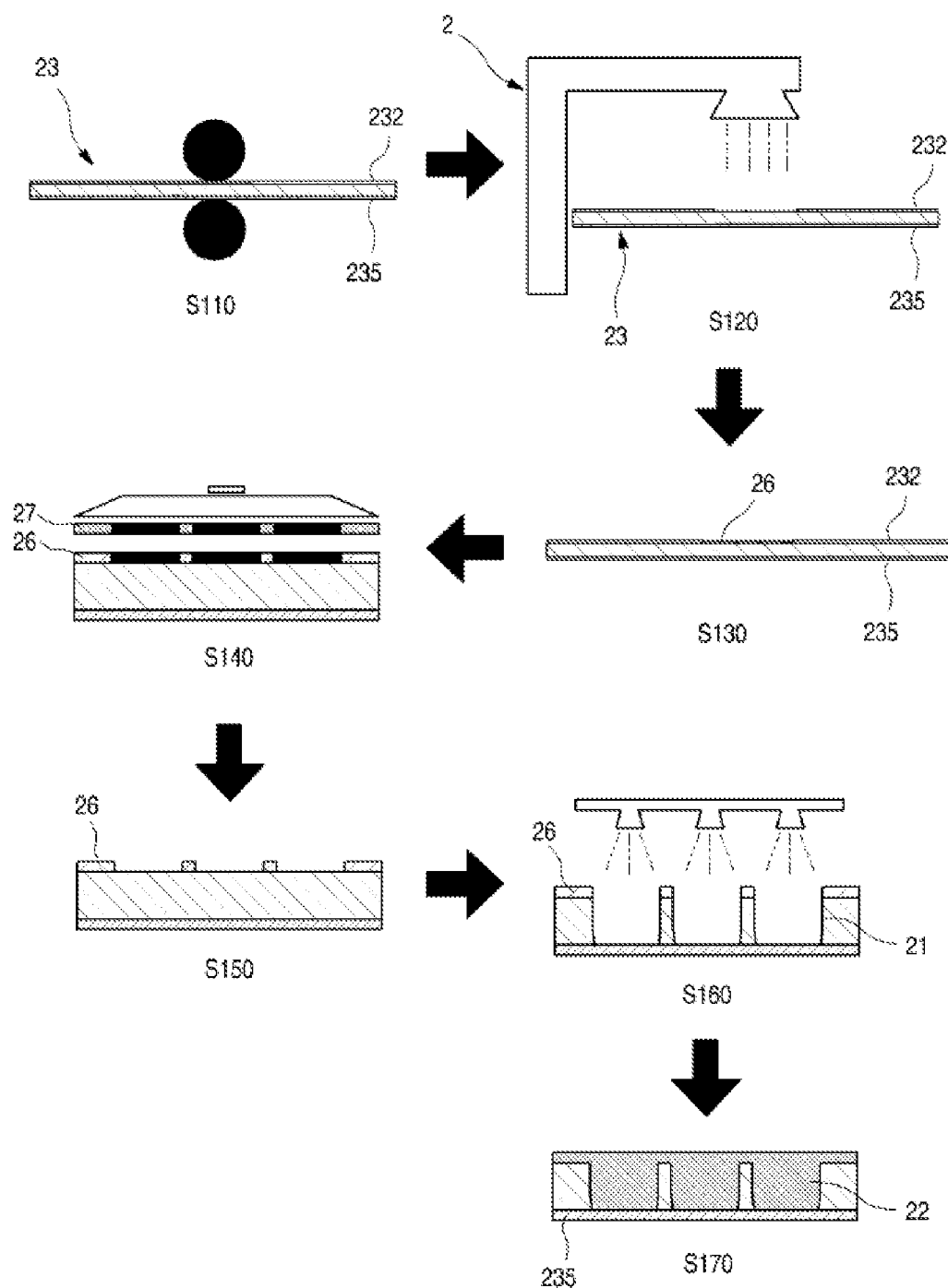

FIGS. 23 and 24 show a sequence of a method of manufacturing the external member (the front panel) for home appliances in accordance with an exemplary implementation of the present invention.

Referring to FIGS. 23 and 24, the external member including the steel plate 23, which the film layer 35 implementing the color or the texture of the front appearance of home appliance is attached to the front surface and the back coating layer 232 for preventing the contamination such as the corrosion of the metal layer is attached to the rear surface is supplied by cutting it to a appropriate length S110.

The steel plate 23 can be pre-treated with an acidic or basic solution for removing the foreign substance of the surface and a planarization.

Subsequently, a particular part of the back coating layer 232 attached to the rear surface of the steel sheet 23 (that is, a region where the through-hole 21 is to be formed) can be moved from the rear surface of the steel plate 23 via the laser irradiation using the laser irradiation device 2. Accordingly, the part which the back coating layer 32 is removed of the rear surface of the steel plate 23 is existed in a state with the metal layer 231 exposed S120.

The back coating layer 232 is then removed to laminate the photosensitive resin 26 on the exposed metal layer 231 and the masking film 27 having a plurality of holes patterned thereon is positioned on the photosensitive resin 26 for the selective curing (S130, S140). Then, the ultraviolet is transmitted through the holes of the masking film to selectively cure the photosensitive resin 26 transmitted with the ultraviolet.

After the curing of the photosensitive resin 26 is completed by an exposure, the masking film 27 is removed and the uncured photosensitive resin is removed through a development processing (S150). Accordingly, the photosensitive resin 26 is existed with a cured state to have a predetermined pattern on the front surface of the metal layer exposed by removing the back coating layer 232.

Also, the metal layer 231, which is existed with still exposed in the absence of the photosensitive resin 26, corresponds to the position where the through-hole 21 is formed (S150). After the development is completed, the heat treatment may be selectively performed to remove a micro bubble in the photosensitive resin 26, or improve the attachment between the photosensitive 26 and the metal layer 231.

Subsequently, after the partial development of the photosensitive resin 26, an etching liquid which is not reactive with the photosensitive resin 26, the film layer 235, and the back coating layer 232 is sprayed to perform the etching with regard to the metal layer 231 which is not covered by the photosensitive rein 26. As such etching liquid, ferric chloride ($FeCl_3$), etc. may be used.

That is, according to the present invention, the etching liquid such as the ferric chloride can prevent the damage of the film layer 235 attached to the front surface of the metal layer 231 by using the etching liquid such as the ferric chloride, etc. selectively reacting with the metal layer 231 in the etching process of forming the through-hole on the metal layer 231.

For example, when the film layer 235 is a PVC-free type film layer, the primer layer 234 and the first adhesive layer 235a are formed of a resin composition that is not reactive with the etching liquid such as ferric chloride, so that it can be prevented from being damaged by the etching liquid during the etching process of forming the through-hole in the metal layer 231. Further, when the film layer 235 is a PVC type film layer, the primer layer 234 and the PVC layer 235g is formed with the resin composition which is not reactive with the etching liquid such as ferric chloride such that it is not damaged by the etching liquid in the etching process.

At this time, by adjusting the concentration of the etching liquid, the injection rate of the etching liquid, or the exposure time for the etching liquid used for etching it is preferable that the width of the front opening of the through-hole 21 penetrating the metal layer 231 is formed to be smaller than that of the rear opening. Alternatively, a mask having a size smaller than that of the exposed metal layer 231 may be attached and etched so that the width of the front opening of the through-hole 21 is formed to be smaller than that of the rear opening.

After the etching is completed, the process of removing the photosensitive rein 26 from the metal layer 231, and printing the ink layer 22 to fill the empty space formed by the through-hole 21 is performed.

At this time, according to the present invention, since the through-hole 21 has a tapered shape or a stepped shape that narrows from the rear surface to the front surface of at least steel sheet 23 or the metal layer 231, when the ink is dropped into the through-hole 21 through the screen printing, it can be sufficiently filled from the front opening of the through-hole which contacts with the film layer 235 by a gravity. Particularly, in the case of the ink used for filling the through-hole 21, since the ink has a predetermined viscosity, when the through-hole 21 is vertically penetrated, the case which is not filled uniformly in the empty space formed by the through-hole 21 may be generated when the through-hole is penetrated vertically. Therefore, as described above, the through-hole 21 has the benefit which can improve the filling efficiency of the ink through the screen printing, by taking a string shape.

As the ink used to form the ink layer 22, a thermal drying type printing ink such as an acrylic resin based ink, etc. may be used.

Further, it is preferable that the ink used for forming the ink layer 22 by the screen printing has a viscosity of 20,000 cps to 40,000 cps. When it is smaller than 20,000 cps of the ink used for the screen printing, there is a possibility that the ink may leak from the through-hole 21 during the process because a sufficient viscosity of the ink is difficult to be secured under a normal condition. Accordingly, when the subsequent process is processed in a state which the ink leaks and the through-hole 21 is not sufficiently filled, there is the possibility of generating the problem of the corrosion of the through-hole 21 or which the display quality of the light penetrating the through-hole 21. Meanwhile, when the viscosity of the ink used for the screen printing is larger than 40,000 첸, there is a possibility that the ink is not sufficiently filled inside the through-hole in the fine size.

In addition, it is preferable that the ink used for the screen printing further includes 1 to 5% by weight of silica based on the weight of the total ink. There is a benefit that the silica has the appropriate viscosity, while imparting a light scattering effect when light dispersed evenly in the ink layer 22 filled in the through-hole 21 passes through the ink layer 22, thereby further increasing the brightness of light discharged through the through-hole 21.

The ink is filled from the front opening part of the through-hole 21 which contacts with the film layer 235 through the screen printing using the ink so that the inner circumferential surface of the through-hole 21 is prevented from being corroded by contacting with the air or the moisture, and the foreign substance can be prevented from entering the empty space formed by the through-hole 21. The film layer 235 which shields the front opening of the through-hole 21 by the ink layer 22 filled in the through-hole 21 can be supported from the rear.

Further, it is preferable that the ink layer 22 is printed to completely filling the through-hole 21 and simultaneously cover a particular part (that is, the region removed with the back coating layer 232) of the rear surface of the metal layer 231. Accordingly, it is possible to prevent the display quality of light passing through the through-hole 21 from being degraded since the ink is not sufficiently filled in the through-hole 21. In addition, by functioning as the back coating layer 232 removed with the ink layer 22, the rear surface of the exposed metal layer 231 can be prevented from being in contact with the air or the moisture and being corroded.

Figure 25:
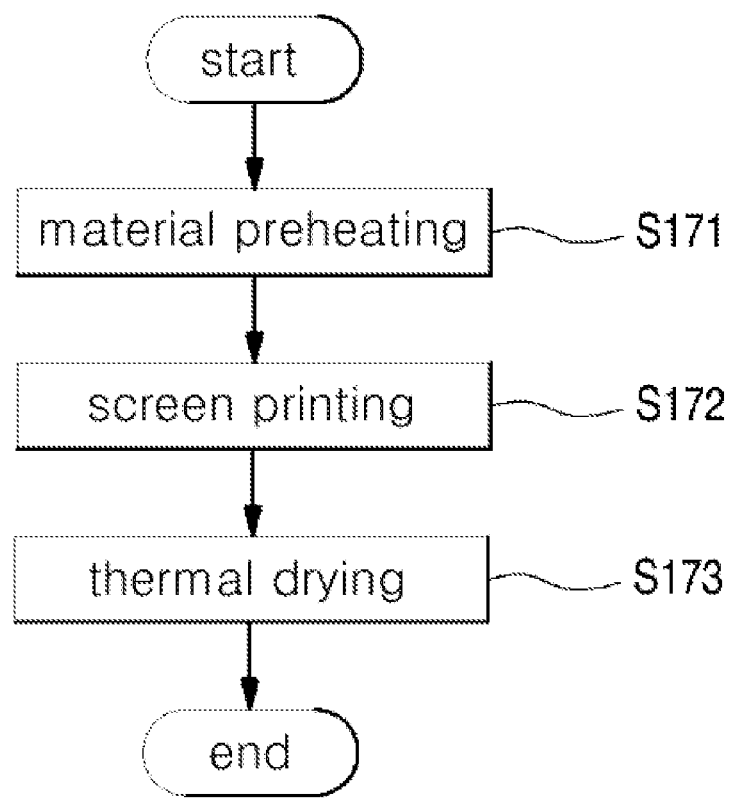
FIGS. 25 to 27 show the step of printing the ink layer on the through-hole formed in the metal layer.
Figure 26:
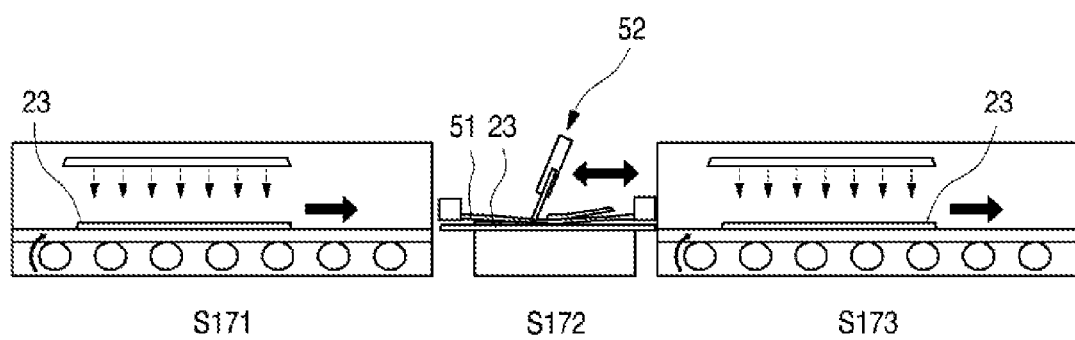
Figure 27:
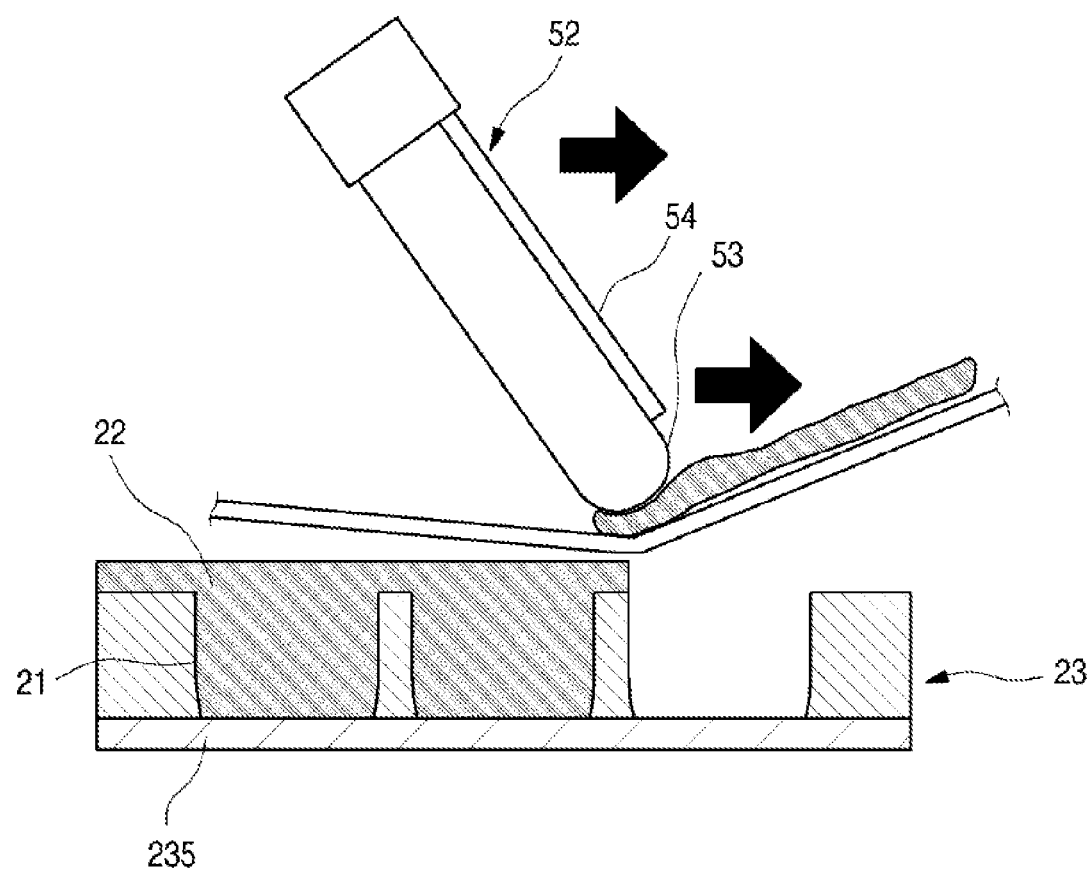

FIGS. 25 to 27 show the steps of printing the ink layer on through-holes formed in a steel sheet.

Referring to FIGS. 25 to 27, the steel plate 23 formed with the through-hole 21 is in a state in which the front opening of the through-hole 21 is shielded by the film layer 235, and the rear opening is in the open state so that the ink for forming the ink layer 22 through the rear opening can be received.

At this time, it is preferable that the screen printing is performed after preheating the formed steel plate 23 of the through-hole 21, prior to the screen printing S171, S172. When the steel plate is preheated to a predetermined temperature, the surface energy of the metal layer 231 is reduced to reduce the surface tension of the ink to be printed, so that the ink can be sufficiently filled from the front opening of the through-hole 21. In addition, when the ink is printed with the metal layer 231 preheated to a predetermined temperature, the viscosity of the ink temporarily decreases to improve the fluidity of the ink on the surface of the metal layer 231 and in the through-hole 21.

After the screen printing is completed, when the thermal drying is performed, the viscosity of the ink is recovered again to decrease the fluidity, consequently forming the ink layer 22 which is stably cured.

Referring to FIG. 27, it can be found more in detail that the screen printing is performed from the rear surface of the steel plate 23 formed with the through-hole 21.

The preheated steel plate 23 is arranged such that the film layer 235 faces downward, so that the rear opening of the through-hole 21 faces upward. Then, the ink is filled in the through-holes 21 by letting the ink flow down through the mesh in a state where the through-holes 21 are all positioned under the mesh of the plate 51.

In addition, the ink layer 22 formed by the screen printing is filled with the through-hole 21 and the ink layer 22 may be further formed which is protruded from the rear opening by a predetermined height or has the predetermined thickness at the rear surface of the steel plate 2. At this time, the thickness of the ink layer 22 protruding from the rear surface of the steel sheet 23 is preferably such that light does not leak in the lateral direction through the ink layer 22.

Figure 28:
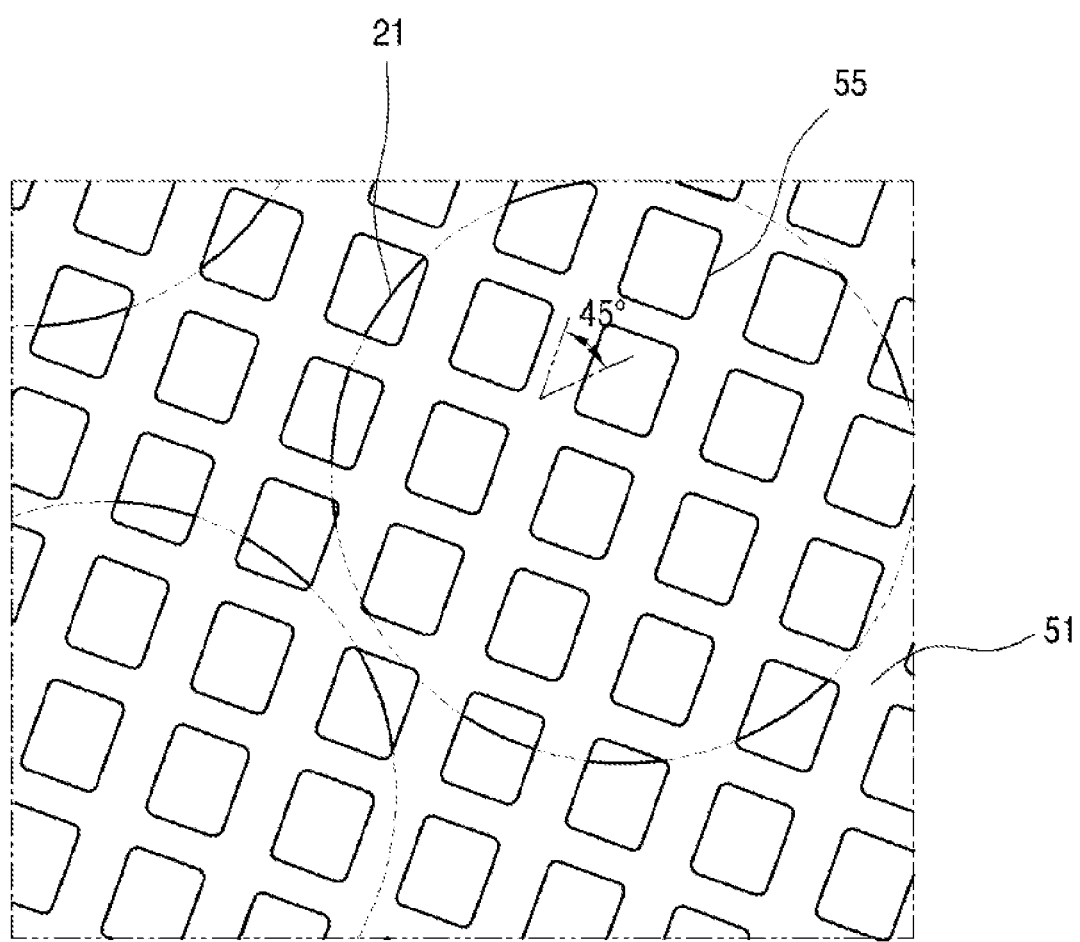
FIG. 28 is an enlarged view showing the relationship between the mesh of the plate making used in printing the ink layer and the through-hole formed in the metal layer.

FIG. 28 is an enlarged view showing the relationship between the mesh of the plate used in printing the ink layer and the through-holes formed in the steel plate.

Unlike the screen printing for printing a pattern, the plate 51 used for the screen printing is important to fill the ink in the through-hole 21, and thus, it is preferable to use the plate 51 having 45° string angle such that the number of the mesh about one through-hole 21 can be further formed compared to the general screen plate.

Referring to FIG. 28, the mesh 55 formed on the plate 51 has the string angle of 45°, and can effectively fill the ink inside the through-hole 21 compared to the general screen printing by arranging total 13 rooms meshes 55 in one through-hole 21.

In addition, the plate 51 is seated to be adjacent to the rear surface of the steel plate 23 within about 5 mm, such that the plate 51 is prevented from being moving upward in the screen painting. Accordingly, by minimizing the gap spaced apart from the rear surface of the steel plate 23 in the screen printing, it is possible to uniformly fill the ink inside the through-hole 21.

The squeeze 52 may be provided for filling into the through-hole 21 by the physical force on the upper part of the plate 51 in the screen printing. In a static supplied with the ink in the plate 51, the squeeze 52 moves by pressing the plate 51, and accordingly, the ink passes through the mesh 55 of the plate 51 and filled into the through-hole 21. At this time, the end 53 of the squeeze 52 contacting with the plate 51, and the dropped amount of the ink through the mesh 55 of the plate 51, thereby improving the efficiency of the screen printing inside the through-hole 21.

In addition, the squeeze 52 may further include a support member 54. The support member 54 is attached to one side of the squeeze 52 and has a shape extending along the longitudinal direction of the squeeze 52. The support member 54 serves to support the squeeze 52 to prevent the deformation that may occur when the squeeze 52 of the elastic material is moved at the top of the plate 51 in a state of applying the physical force, thereby preventing the reliability and reproducibility of the screen printing from being degraded. Further, the support member 54 may be inserted inside the squeeze 52 as necessary, or may be provided in other material or shape other than the high strength steel plate.

Additionally, after printing the ink layer 22 on the rear surface of the steel plate 23, an additional printing layer can be formed along the periphery of the ink layer 22 such that the additional printing layer does not transmit light. Thus, the additional printing layer prevents light from leaking to other region other than the ink layer 22.

Figure 29:
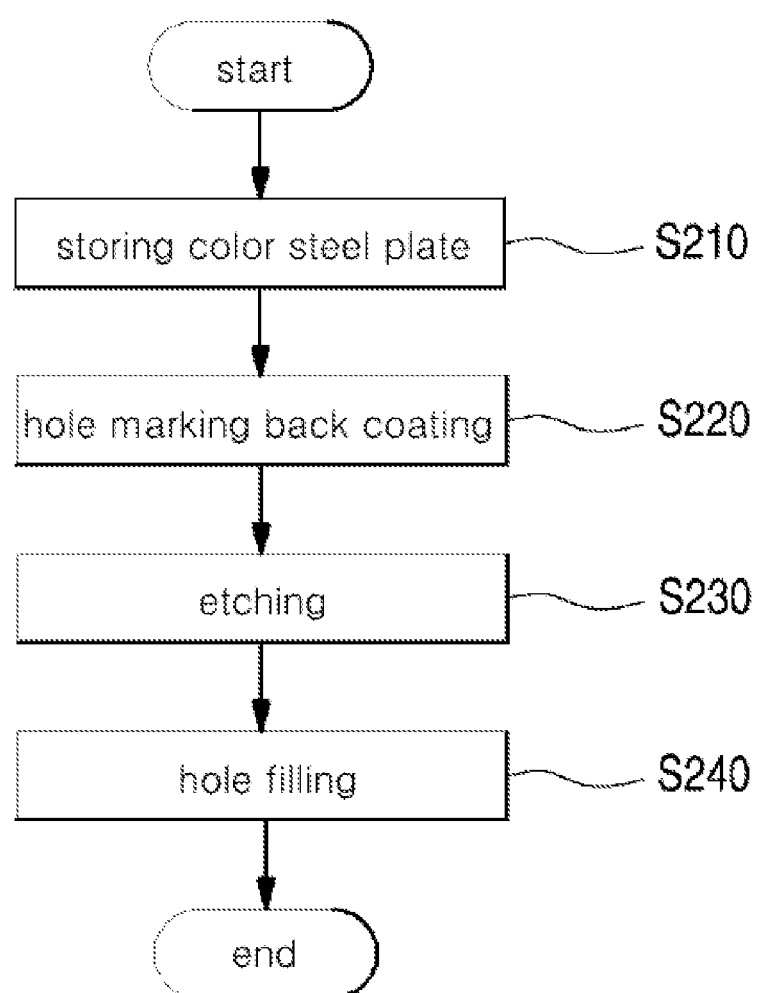
FIGS. 29 and 30 show a sequence of the method of manufacturing the external member (the front panel) for home appliances in accordance with another implementation of the present invention.
Figure 30:
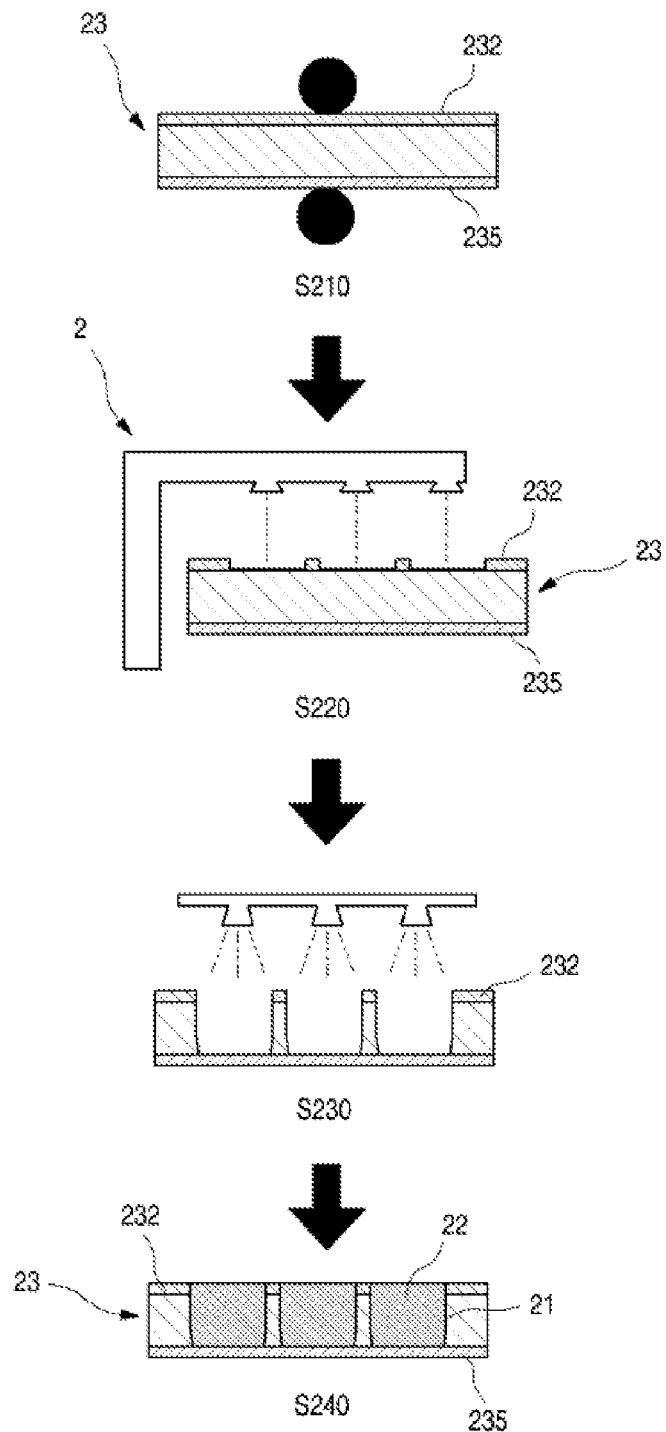

FIGS. 29 and 30 show the sequence of the method of manufacturing the exterior member (the front panel) for home appliances in accordance with another implementation of the present invention.

Referring to FIGS. 29 and 30, unlike the sequence shown in FIGS. 23 and 24, when removing the back coating layer 232 from the rear surface of the steel plate 23, the back coating layer 232 is removed with the size corresponding to one through-hole 21, and thus, it does not need the additional layer such as the laminating, the exposure, and the development of the photosensitive resin.

The back coating layer 232 can be removed to a size corresponding to one through-hole 21 through the hole marking using the laser irradiation device 2 and it is preferable that the diameter or width of the hole formed in the back coating layer 232 by the hole marking coincides with those of the rear opening of the through-hole 21 (S220).

Accordingly, when a back order etching process is performed, the metal layer 231 is etched through the hole formed in the back coating layer 232, and the size of the rear opening of the through-hole 21 formed in the metal layer 231 almost coincides with that of the hole formed in the back coating layer 232.

The light transmitting ink layer 22 is then formed which fills the through-hole 21 through the screen printing, and at this time, the ink layer 22 is printed to be protruded from the rear opening by a predetermined height. Preferably, the thickness of the layer ink 22 protruded from the rear opening of the through-hole 21 is formed to almost coincide with that of the back coating layer 232, such that it is possible to decrease the stepped part of the rear surface of the steel plate 23.

Figure 31:
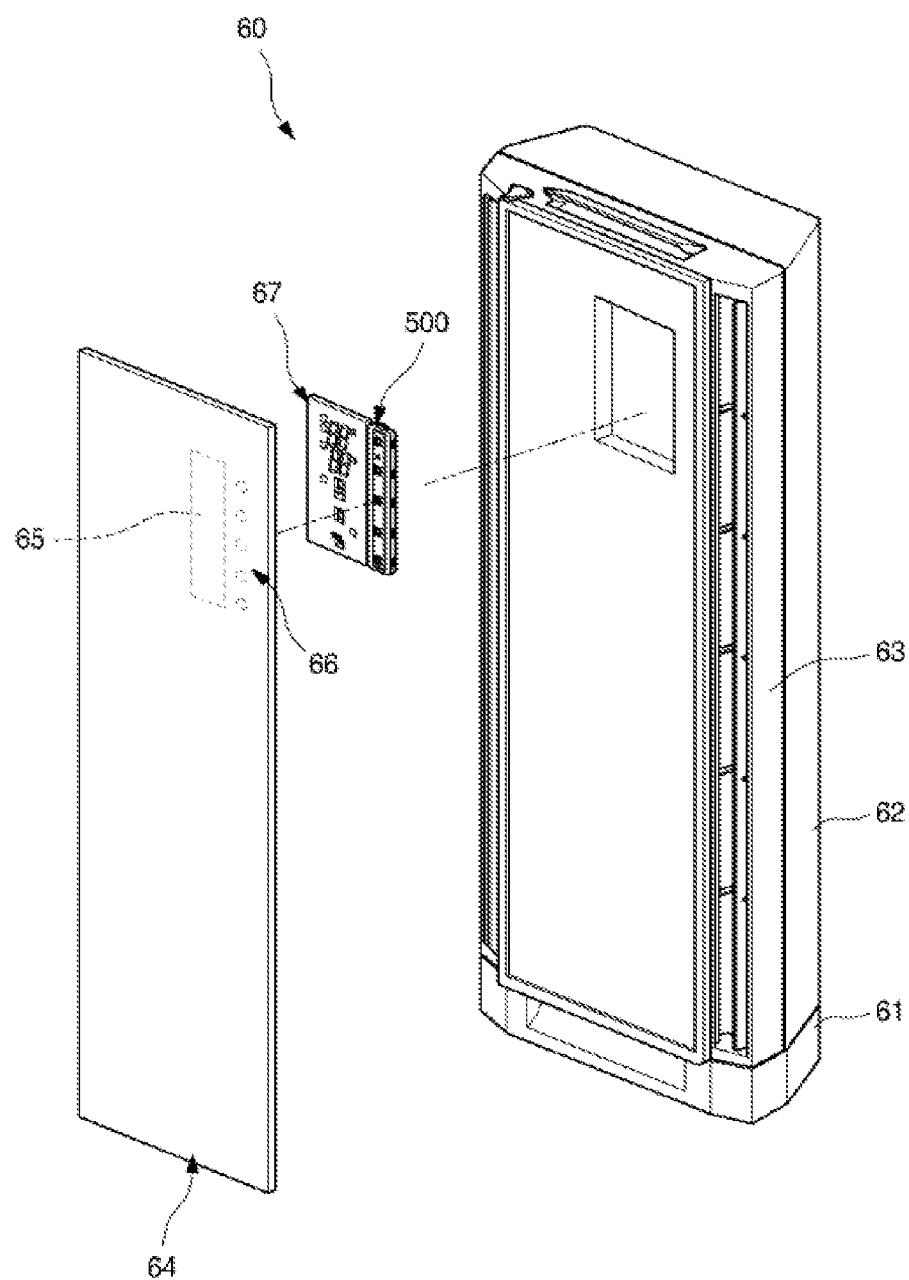
FIG. 31 is an exploded perspective view of an air conditioner used with the external member (the front panel) for home appliances in accordance with an exemplary implementation of the present invention.

FIG. 31 is an exploded perspective view of the air conditioner used with the external member (the front panel) for home appliances in accordance with one implementation of the present invention.

Referring to FIG. 31, the overall appearance of the indoor unit 60 of the air conditioner is formed by a case. The case includes a base 61, a rear cabinet arranged on the upper side of the rear part of the base 61 and a front cabinet 63 arranged on the upper part of the front part of the base 61, and the external member 64 may be arranged on the front surface of the front cabinet 63.

The base 61, the rear cabinet 62, and the front cabinet 63 are coupled to each other to form a predetermined space therein. A blowing fan and a flow path for intake and discharge of the air are provided, and a filter assembly for filtering the intake air, a heat exchanger for heat exchange of the intake air, and a configuration for driving the refrigeration cycle are accommodated. In addition, the base 61, the rear cabinet 62, and the front cabinet 63 are provided with a plurality of an intake which the external air is intaken, and the discharge part of discharging the heat exchanged air.

The external member 64 is installed to the front cabinet 63. The front surface of the front cabinet 63 can be opened by pivoting or detaching the external member 64 or the configuration installed with the external member 64, and it is configured such that the operation and the maintenance of the configuration provided in the inside and outside of the front cabinet 63 are possible. In addition, the external member 64 is a part of constructing the appearance of the indoor unit 60 and can be installed on one side of the case.

The external member 64 may be formed with a display part 65 for displaying the operating state of the air conditioner. The display part 65 may be formed as a unit set of fine through-holes as in the above-described implementations.

The through-holes are configured in the same manner as the implementation related to the above-described refrigerator, and can be formed in the same method. If necessary, a touch operation part 66 may be formed on one side of the display part 65 by printing or surface processing.

A display assembly 67 is provided on the rear of the display unit 65 and the light-emitting device mounted on the display assembly 67 provides light to the display part 65 to display operation information of the air conditioner. The display assembly 67 includes a combination of the light-emitting devices to display operational information in the form of numbers, letters, figures or symbols.

Like the implementations related to the refrigerator, when the light-emitting device of the display assembly 67 is turned on, operation information is displayed at the front surface of the external member 64 by light passing through the through-hole, but, when the light-emitting device is turned off, the through-hole is shielded by the film layer of the external member 64, and thus, the existences of the through-hole as well as the display part are not observed visually.

The touch sensor assembly 500 may be attached to the rear surface of the external member 64 corresponding to the touch operation part 66. The touch sensor assembly 500 is adhered by an adhesive such as an adhesive or a double-sided tape, and the touch sensor assembly 500 closely contacts the touch operation part 66 to recognize a touch operation of the user.

Figure 32:
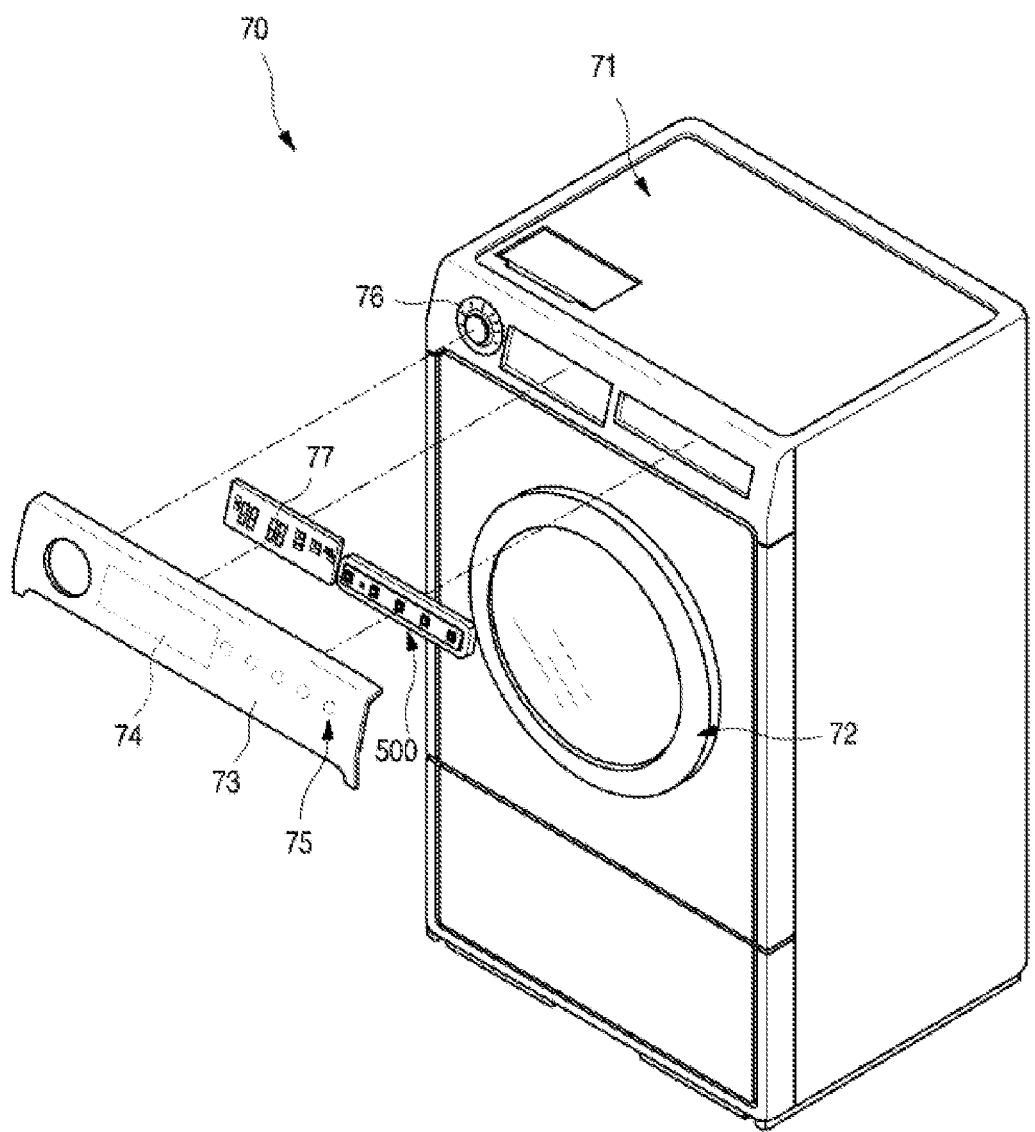
FIG. 32 is an exploded perspective view of a washing machine used with the external member (the front panel) for home appliances in accordance with an exemplary implementation of the present invention.

FIG. 32 is an exploded perspective view of a washing machine used with an external member (the front panel) for home appliances in accordance with an exemplary implementation of the present invention.

Referring to FIG. 32, the washing machine 70 includes a washing machine main body 71 of forming the appearance, a tub stored with the washing water, a drum rotatably arranged inside the tub and a laundry is received, a drive device of transferring a rotational force for the rotation of the dram, the washing water supplying device of supplying the washing water to said tub, and a discharging device for discharging the washing water.

A particular part of the front surface of the washing machine main body 71 is opened and formed such that the laundry is put into the drum, and the opening of the laundry body 71 can open and close by the door 72. For this, the door 72 is rotatably installed on the main body.

The external member 73 may be provided on the front and upper surfaces of the washing machine main body 71 except the door 72. In addition, the display part 74 and the touch operation part 75 may be formed on at least a part of the external member 73.

The display part 74 displays the operating state of the washing machine 70 and may be formed as a unit set of fine through-holes as described above. The through-holes are configured in the same manner as the implementations related to the above-described refrigerator, and can be formed in the same manner. The touch operation part 75 is provided to operate the washing machine 70 by the touch operation of the user and may be provided with a dial type knob 76 for operating the washing machine 70.

The display assembly 77 is provided on the rear part of the display unit 74 and the light-emitting device mounted on the display assembly 77 provides light to the display window 74 to display operation information of the washing machine 70. The display assembly 77 includes a combination of the light-emitting devices to display operational information in the form of numbers, letters, figures or symbols.

Like the refrigerator, when the light-emitting device of the display assembly 77 is turned on, operation information is displayed to the front surface of the external member 73 by light passing through the through-holes; but, when the light-emitting device is turned off, the through-holes are shielded by the film layer of the external member 73, and thus, the existences of the display part as well as the through-hole are not observed visually.

The touch sensor assembly 500 may be attached to the rear surface of the external member 73 corresponding to the touch operation part 75. The touch sensor assembly 500 is adhered by the adhesive such as the adhesive or the double-sided tape, and the touch sensor assembly 500 closely contacts the touch operation part 75 to recognize a touch operation of the user.

Figure 33:
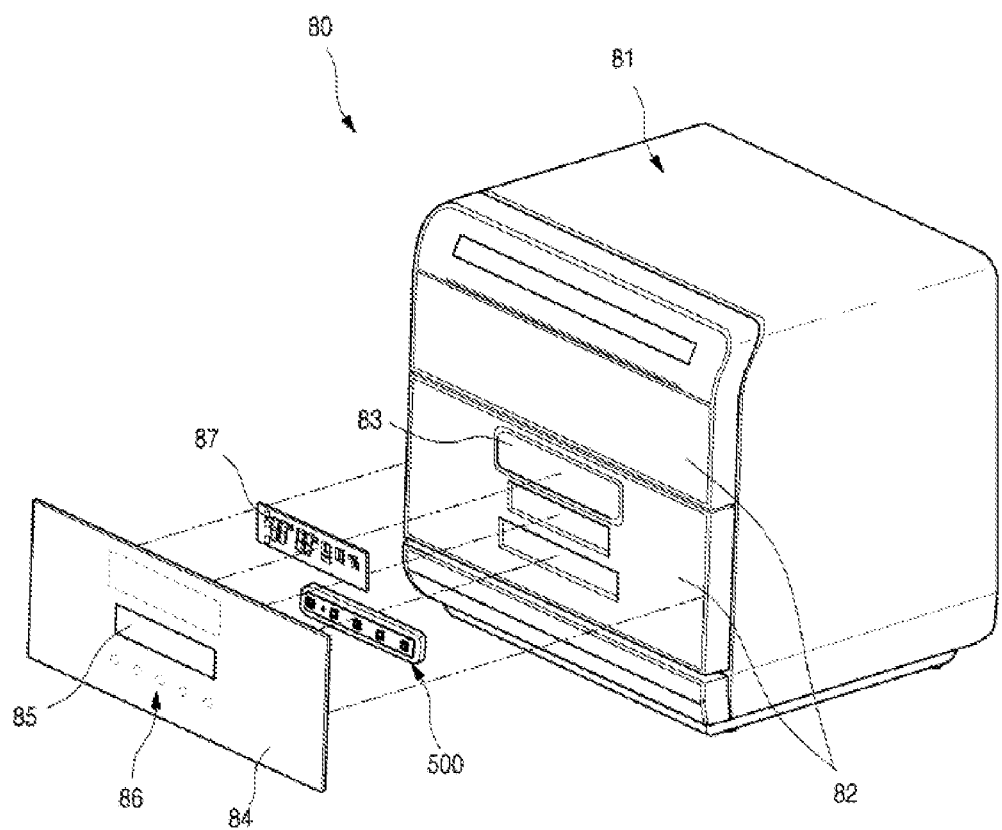
FIG. 33 is an exploded perspective view of a dish washer used with the external member (the front panel) for home appliances in accordance with an exemplary implementation of the present invention.

FIG. 33 is an exploded perspective view of a dish washer used with the external member (the front panel) for home appliances in accordance with an exemplary implementation of the present invention.

Referring to FIG. 33, the appearance of the dish washer 80 provided with the touch sensor assembly 500 in accordance with an exemplary implementation of the present invention is formed by the dish washer main body 81 formed in approximately rectangular parallelepiped shape and the shape thereof is not limited.

The dish washer 80 includes a main body 81, a cavity in which dishes are received inside the main body 81 for washing, a rack member that is input/output from the cavity and the dishes are seated, a water supply device for supplying the water into inside the cavity for washing, and a discharge device for discharging the washed water.

The main body 81 is provided with a door 82, the door 82 selectively shields the opened front surface of the main body 81, and forms the front appearance of the dish washer 80 in a state where the door 82 is closed.

The door 82 includes an upper door and a lower door, and can be formed to have a structure in which the upper door can be opened and closed with communicated when the lower door is operated. Further, the lower door may be provided with a handle 83 for opening and closing the door 82.

The front surface of the door 82, that is, the front surface of the upper door and the lower door may be attached with the external member 87 of forming the appearance and the external member 84 forms the upper and lower parts door itself. The external member 84 forms at least part of the front surface of the door 82 and the external member 84 is provided with the display part 85 for displaying the operation sate of the dish washer 80.

The display part 85 may be formed as a set of the fine through-holes as in the above-mentioned implementation and the through-holes are configured in the same method as the implementation related to the refrigerator described above, and may be formed in the same method.

The display assembly 87 is provided on the rear part of the display unit 85 and light is transmitted to the display part 85 by the light-emitting device mounted on the display assembly 87, thereby displaying operation information of the dish washer 80. The display assembly 87 includes a combination of a plurality of light-emitting devices and is displayed in the form of numbers, letters, figures or symbols.

Like the implementation related to the refrigerator, when the light-emitting device of the display assembly 87 is turned on, operation information is displayed on the front surface of the external member 84 by light passing through the through-holes; however, when the light-emitting device turn off, the through-holes are shielded by the film layer of the external member 84, and thus, the existences of the display part as well as the through-hole are not observed visually.

A touch operation part 86 can be formed on one side of the display part 85 by the printing or the surface processing. In addition, the touch sensor assembly 500 may be attached to the rear surface of the external member 84 corresponding to the touch operation unit 86. The touch sensor assembly 500 is adhered by an adhesive member such as an adhesive or a double-sided tape, and the touch sensor assembly is closely attached to the touch operation unit to recognize the touch operation of the user.

Figure 34:
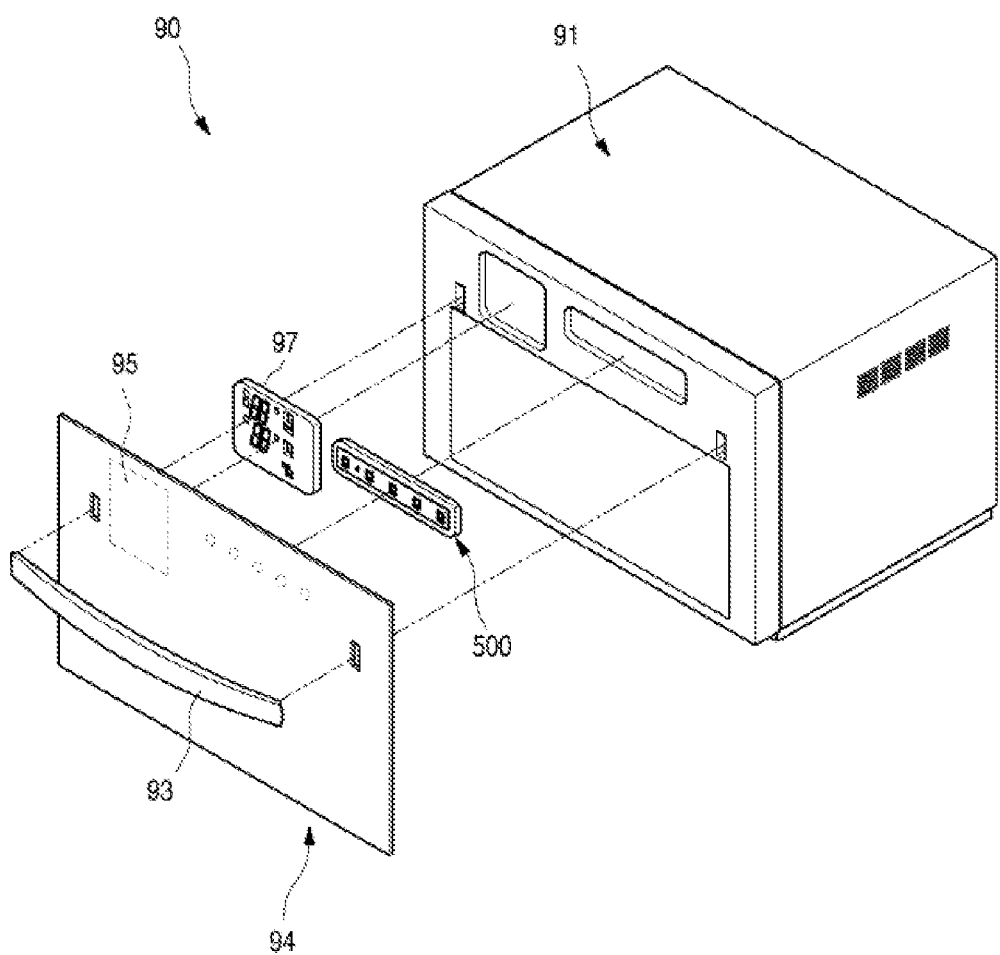
FIG. 34 is an exploded perspective view of a cooking appliance used with the external member (the front panel) for home appliances in accordance with an exemplary implementation of the present invention.

FIG. 34 is an exploded perspective view of a cooking appliance used with the external member (the front panel) for home appliances in accordance with an exemplary implementation of the present invention. Here, the cooking appliance may be an oven, a microwave oven, etc.

Referring to FIG. 34, the outer shape of the cooking device 90 provided with the touch sensor assembly 500 is formed by the cooking device main body 91 formed in a approximately rectangular parallelepiped shape, but the shape thereof is not limited.

The cooking appliance 90 includes a main body 91, a cavity which food is received for cooking inside the main body 91, the heating means or a magnetron for cooking the food inside the cavity, and a fan assembly for convection inside the cavity.

The main body 91 is provided with a door 92, the door 92 selectively shields the opened front surface of the main body 91, and forms the front appearance of the cooking appliance 90 in a state in which the door 92 is closed.

The door 92 is coupled to the main body 91 using a hinge and is rotatable, and is rotated in the left-right direction or the up-down direction to selectively open and close the opened front surface of the cooking appliance 90. In addition, the door 92 is provided with a handle 93 for opening and closing operations of the door.

The front surface of the door 92 may be provided with the external member 94 which forms the front appearance of the door 92. The external member 94 is not necessarily limited to the door 92 and may form one side of the cooking appliance main body 91.

The external member 94 may be provided with the display part 95 for displaying the operating state of the cooking appliance 90. The display part 95 may be formed as a set of the fine through-holes as in the above-mentioned implementation. The through-holes are configured in the same manner as the implementation related to the above-described refrigerator, and can be formed in the same method.

A display assembly 97 is provided on the rear part of the display unit 95 and operational information of the cooking appliance 90 may be displayed by irradiation light into the display window 95 by the light-emitting device mounted on the display assembly 97. The display assembly 97 includes a combination of light-emitting devices and displays information in the form of numbers, letters, figures or symbols.

Like the implementation related to the refrigerator, when the light-emitting device of the display assembly 97 is turned on, operating information is displayed on the front surface of the external member 94 by light passing through the through-holes; however, when the light-emitting device is turned off, the through-holes are shielded by the film layer by the external member 94, and thus, the existences of the display part as well as the through-role are not observed visually.

In addition, a touch operation part 96 can be formed on one side of the display part 95 by the printing or the surface processing. The touch sensor assembly 500 may be attached to the rear surface of the external member 94 corresponding to the touch operation part 96. The touch sensor assembly 500 is adhered by the adhesive such as the adhesive or the double-sided tape, and the touch sensor assembly 500 closely contacts the touch operation part 96 to recognize the touch operation of the user.

As described above, while the present invention has been described with reference to exemplary drawings thereof, it is to be understood that the invention is not limited by the exemplary implementations and the drawings disclosed in the specification, and it is obvious that many variations can be made by a person skilled in the art within the range of the technical idea of the present invention. In addition, although the working effect according to the configuration of the preset invention is not explained by explicitly describing it while explaining the above implementations of the present invention hereinabove, it is natural that the effect which is predictable by the corresponding configuration has to be also acknowledged.

What is claimed is:

1. An external member for a home appliance, the external member comprising:
    a film layer that defines a color or a texture of an external appearance of the home appliance;
    a metal layer that is coupled to a rear surface of the film layer and that covers a display assembly including a plurality of light-emitting devices; and
    a display cover that is coupled to a rear surface of the metal layer and that is configured to accommodate the display assembly,
    wherein the metal layer comprises:
        a plurality of through-holes that penetrate predetermined regions of the metal layer corresponding to the plurality of light-emitting devices, and
        an ink layer that fills each of the plurality of the through-holes and is configured to transmit light emitted from the light-emitting devices,
    wherein the display cover includes a plurality of guide holes through which light emitted from the light-emitting devices of the display assembly passes, the plurality of guide holes corresponding to the plurality of through-holes, respectively,
    wherein, in a state in which at least one of the light-emitting devices is turned on to display operation information on a front surface of the home appliance, light emitted from the at least one of the light-emitting devices is transmitted through the ink layer and the film layer, and
    wherein, in a state in which the light-emitting devices are turned off, the film layer is configured to block a front opening of each of the plurality of the through-holes to an outside of the home appliance.

2. The external member of claim 1, wherein the ink layer is protruded from a rear opening of each of the plurality of through-holes.

3. The external member of claim 1, wherein the ink layer is further configured to cover a part of the rear surface of the metal layer.

4. The external member of claim 1, wherein the film layer comprises:
a primer layer that is coupled to a front surface of the metal layer, and a coating layer that is coupled to a front surface of the primer layer.

5. The external member of claim 4, wherein the film layer further comprises:
a thin metal film layer that is coupled to a front surface of the coating layer, and a pattern layer that has an imprinting pattern on either a front surface of the pattern layer or a rear surface of the pattern layer.

6. The external member of claim 1, wherein the ink layer comprises silica.

7. The external member of claim 1, further comprising a light diffusion sheet that is located between the rear surface of the metal layer and the display cover.

8. The external member of claim 1, wherein a guide hole of the plurality of guide holes is configured to guide light from the light-emitting devices to two or more of the plurality of through-holes.

9. The external member of claim 1, wherein each of the guide holes has a front aperture that is located adjacent to a front surface of the display cover, and a rear aperture that is located adjacent to a rear surface of the display cover, and
wherein a width of the front aperture is larger than a width of the rear aperture.

10. The external member of claim 1, wherein the film layer covers the predetermined regions of the metal layer at which the through-holes are defined and a neighboring region of the predetermined regions.

11. The external member of claim 1, wherein the ink layer is further configured to cover an entire area that includes two or more unit sets of the plurality of through-holes.

12. A method for manufacturing an external member for a home appliance, the method comprising:
providing (i) a film layer that defines a color or a texture of the home appliance and (ii) a metal layer that is coupled to a rear surface of the film layer;
laminating a photosensitive resin on a rear surface of the metal layer;
positioning a masking film including a plurality of holes on a rear surface of the photosensitive resin;
after positioning the masking film, curing the photosensitive resin by irradiating ultraviolet through the plurality of holes of the masking film;
removing the masking film and an uncured portion of the photosensitive resin;
forming a plurality of through-holes by spraying an etching liquid onto the rear surface of the metal layer;
injecting, into the plurality of through-holes, an ink layer that is configured to transmit light; and
coupling a display cover to the rear surface of the metal layer, the display cover being configured to accommodate a display assembly including a plurality of light-emitting devices,
wherein the display cover includes a plurality of guide holes through which light emitted from the light emitting devices of the display assembly passes, the plurality of guide holes corresponding to the plurality of through holes, respectively.

13. The method of claim 12, wherein the film layer is configured to block a front opening of each of the plurality of the through-holes to an outside of the home appliance.

14. A refrigerator comprising:
a cabinet that defines a storage space; and
a refrigerator door disposed at the cabinet and configured to open and close the storage space,
wherein the refrigerator door comprises:
an external member that defines a front appearance of the refrigerator door, and
a display assembly that includes a plurality of light-emitting devices and is covered by the external member, and
wherein the external member comprises:
a film layer that defines a color or a texture of an external appearance of the refrigerator door,
a metal layer that is coupled to a rear surface of the film layer and that covers the display assembly, and
a display cover that is coupled to a rear surface of the metal layer and that is configured to accommodate the display assembly, and
wherein the metal layer comprises:
a plurality of through-holes that penetrate predetermined regions of the metal layer corresponding to the plurality of light-emitting devices, and
an ink layer that fills the through-holes and is configured to transmit light emitted from the light-emitting devices,
wherein the display cover includes a plurality of guide holes configured to transmit light emitted from the light-emitting devices of the display assembly, the plurality of guide holes corresponding to the plurality of through-holes, respectively,
wherein, in a state in which at least one of the light-emitting devices is turned on to display operation information on a front surface of the refrigerator, light emitted from the at least one of the light-emitting devices is transmitted through the ink layer and the film layer, and
wherein the film layer covers the predetermined regions of the metal layer at which the through-holes are defined and a neighboring region of the predetermined regions such that, in a state in which the light-emitting devices are turned off, the film layer is configured to block a front opening of the through-holes to an outside of the refrigerator.

15. The refrigerator of claim 2, further comprising:
a frame attached to the rear surface of the external member and providing a separate space inside the refrigerator door to receive the display cover and the display assembly, wherein the frame includes a front surface and an upper surface that are open, and defines a space having an opened upper surface when attached to the external member; and
a light diffusion sheet that is located between the rear surface of the metal layer and the display cover.

16. The refrigerator of claim 15, further comprising a decorative member that defines an upper appearance of the refrigerator door, the decorative member including an insertion part and an insertion part cover that is configured to open and close the insertion part,
wherein the insertion part penetrates through the decorative member and communicates with the space defined by the frame.

17. The refrigerator of claim 16, wherein the ink layer is further configured to cover a part of the rear surface of the metal layer, and to cover an entire area that includes two or more unit sets of the plurality of through-holes.

18. The refrigerator of claim 15, further comprising:
a support plate that is installed on an upper part of the display cover and supports a rear side of the external member, wherein the frame comprises a plate supporting part that is disposed at sides of an upper part of the frame and that supports the support plate.

* * * * *